(12) United States Patent
Yoshida

(10) Patent No.: US 9,275,932 B2
(45) Date of Patent: Mar. 1, 2016

(54) ACTIVE MATRIX SUBSTRATE, AND DISPLAY DEVICE

(75) Inventor: Masahiro Yoshida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/119,391

(22) PCT Filed: May 17, 2012

(86) PCT No.: PCT/JP2012/062619
§ 371 (c)(1),
(2), (4) Date: Nov. 21, 2013

(87) PCT Pub. No.: WO2012/161072
PCT Pub. Date: Nov. 29, 2012

(65) Prior Publication Data
US 2014/0110852 A1    Apr. 24, 2014

(30) Foreign Application Priority Data

May 24, 2011  (JP) .................. 2011-115847

(51) Int. Cl.
| | |
|---|---|
| *H01L 23/48* | (2006.01) |
| *H01L 23/52* | (2006.01) |
| *H01L 29/40* | (2006.01) |
| *G02F 1/1345* | (2006.01) |
| *G02F 1/1362* | (2006.01) |

(52) U.S. Cl.
CPC ............ *H01L 23/48* (2013.01); *G02F 1/13452* (2013.01); *G02F 1/136286* (2013.01); *H01L 2924/0002* (2013.01)

(58) Field of Classification Search
CPC ............ H01L 23/48; H01L 2924/0002; G02F 1/136286; G02F 1/13452
See application file for complete search history.

(56) References Cited

U.S. PATENT DOCUMENTS

| | | | |
|---|---|---|---|
| 6,005,647 A | 12/1999 | Lim | |
| 6,873,392 B2 | 3/2005 | Lim | |
| RE41,873 E * | 10/2010 | Lee et al. | 349/40 |
| 8,083,561 B1* | 12/2011 | Huang et al. | 445/2 |
| 8,134,674 B2* | 3/2012 | Lim et al. | 349/142 |
| 8,742,781 B2* | 6/2014 | Chang et al. | 324/750.3 |
| 8,830,153 B2* | 9/2014 | Huang et al. | 345/92 |
| 2004/0041959 A1* | 3/2004 | Yoo et al. | 349/43 |
| 2004/0125256 A1* | 7/2004 | Park et al. | 349/43 |
| 2010/0109693 A1* | 5/2010 | Lee | 324/755 |
| 2012/0025855 A1* | 2/2012 | Chang et al. | 324/750.3 |
| 2012/0026076 A1* | 2/2012 | Huang et al. | 345/92 |
| 2014/0070835 A1* | 3/2014 | Wen et al. | 324/760.02 |
| 2014/0168559 A1* | 6/2014 | ZHU et al. | 349/43 |

FOREIGN PATENT DOCUMENTS

| | | |
|---|---|---|
| JP | H10-104647 A | 4/1998 |
| JP | 2003-337349 A | 11/2003 |

* cited by examiner

*Primary Examiner* — Jarrett Stark
(74) *Attorney, Agent, or Firm* — Chen Yoshimura LLP

(57) ABSTRACT

An active matrix substrate (5) provided with a plurality of scan lines (G) and a plurality of data lines (Sr, Sg, Sb) arranged in a matrix, in which first, second, and third short bars (31r, 31b, 31g) are connected to the respective data lines (Sr, Sg, Sb), and, among the first, second, and third short bars, the second short bar (31b) in the middle is provided in a different layer from the first and third short bars (31r, 31g) which are positioned on the sides of the second short bar (31b).

13 Claims, 25 Drawing Sheets

ACTIVE MATRIX SUBSTRATE, AND DISPLAY DEVICE

TECHNICAL FIELD

The present invention relates to an active matrix substrate having a plurality of data lines and a plurality of scan lines arranged in a matrix, and to a display device using this.

BACKGROUND ART

In recent years, liquid crystal display devices, for example, are widely used in liquid crystal televisions, monitors, mobile phones, and the like as a flat panel display having advantages compared to conventional cathode-ray tubes in being thinner, lighter, and the like. Among such liquid crystal display devices, those that use an active matrix substrate having a plurality of data lines (source lines) and a plurality of scan lines (gate lines) arranged in a matrix, and having arranged in a matrix switching elements such as thin film transistors (TFTs) in the vicinity of the intersection between the data lines and scan lines, and pixels having pixel electrodes connected to these switching elements in a liquid crystal panel as a display panel are known.

As disclosed in Patent Document 1 below, for example, a configuration is proposed for such conventional active matrix substrates in which three short bars are provided such that separate test signals are inputted respectively to data lines corresponding to red (R), green (G), and blue (B) pixels. In other words, in this conventional active matrix substrate, a plurality of data lines corresponding to the R pixels are connected to a first short bar. A plurality of data lines corresponding to G pixels are connected to a second short bar, and a plurality of data lines corresponding to B pixels are connected to a third short bar. As a result, in the conventional active matrix substrate, by inputting separate test signals to each of the first to third short bars, it was possible to input different test signals to each of the data lines for each of the colors RGB.

RELATED ART DOCUMENT

Patent Document

Patent Document 1: Japanese Patent Application Laid-Open Publication No. H10-104647

SUMMARY OF THE INVENTION

Problems to be Solved by the Invention

However, in such a conventional active matrix substrate, there was a problem that the area where the first to third short bars are disposed cannot be made small.

Specifically, in this conventional active matrix substrate, the first to third short bars were provided so as to be parallel to the direction perpendicular to the data lines so as to be able to be connected with ease to each of the plurality of data lines corresponding therewith. Also, in the conventional active matrix substrate, for the first to third short bars, the same metal film (source layer) used in the data lines, for example, was used, and it was necessary to form the first to third short bars along the above-mentioned perpendicular direction with prescribed gaps therebetween so that short-circuiting does not occur between two adjacent short bars among the first to third short bars. Thus, in a conventional active matrix substrate, it was not possible to make the area where the first to third short bars are to be formed small.

The present invention takes into account the above-mentioned problem, and an object thereof is to provide a compact active matrix substrate with a small area where the short bars are to be disposed, and a display device using this.

Means for Solving the Problems

In order to achieve the above-mentioned object, an active matrix substrate of the present invention includes:

a plurality of data lines and a plurality of scan lines arranged in a matrix; and at least three short bars individually and separately connected to at least either of the plurality of data lines or the plurality of scan lines, wherein each of the at least three short bars is connected to a prescribed number of corresponding data lines or scan lines, and wherein, among the at least three short bars, there exist three adjacent short bars in which a middle short bar is provided in a different layer from short bars on both sides thereof.

In the active matrix substrate configured as described above, among the at least three short bars, there exist three adjacent short bars in which a middle short bar is provided in a different layer from short bars on both sides thereof. As a result, unlike conventional examples, it is possible to make the area where the short bars are disposed small, thus allowing a compact active matrix substrate to be configured. As a result, it is possible to form with ease many active matrix substrates from one motherboard.

Also, in the active matrix substrate, among the at least three short bars, the three adjacent short bars may be configured such that edges of the middle short bar overlap edges of the respective short bars on both sides thereof.

In this case, the area where the short bars are disposed can be made small, thus allowing a compact active matrix substrate to be configured with ease.

Also, in the active matrix substrate, among the at least three short bars, the three adjacent short bars may be configured such that the middle short bar does not overlap the respective short bars on both sides thereof.

In this case, the middle short bar and the respective short bars on both sides thereof do not overlap, and thus, among the three respective short bars, parasitic capacitance that would result from an overlap is not formed. As a result, it is possible to prevent the line load of the respective short bars from becoming large, and even if a signal is supplied to the respective short bars, it is possible to mitigate delays in the signal.

Also, in the active matrix substrate, it is preferable that among the at least three short bars, the three adjacent short bars be configured such that either the middle short bar or the short bars on both sides thereof is made of a first conductive layer provided on a base member, and that another of the middle short bar and the short bars on both sides thereof be made of a second conductive layer provided on a first insulating layer covering the first conductive layer.

In this case, the middle short bar, one side or the other side of the middle short bar and the short bars on both sides thereof are made of the first conductive layer and the second conductive layer provided in different layers on the base member, and thus, it is possible to effectively reduce the size of the area where the short bars are disposed.

Also, in the active matrix substrate, end portions of the data lines or end portions of the scan lines may be made of the first conductive layer, among three adjacent lines of the data lines or the scan lines, a line on one side of a middle line may be connected to a first short bar made of the first conductive layer through a first connecting line made of the first conductive layer, a line on another side of the middle line may be connected to a second short bar made of the second conductive layer through a second connecting line made of the second conductive layer, and the middle line may be connected to a third short bar made of the first conductive layer through a third connecting line made of a third conductive layer provided on a second insulating layer covering the second conductive layer.

In this case, it is possible to appropriately connect the corresponding data lines or scan lines while making the area where the first to third short bars are disposed small.

Also, in the active matrix substrate, it is preferable that a plurality of the third connecting lines be connected to each other over the third short bar.

In this case, it is possible to make the resistance of the third connecting lines small, and it is also possible to make the resistance of the third short bar small, and thus, it is possible to reduce the width of the third short bar.

Also, in the active matrix substrate, end portions of the data lines or end portions of the scan lines may be made of the first conductive layer, among three adjacent lines of the data lines or the scan lines, a line on one side of a middle line may be connected to a first short bar made of the first conductive layer through a first connecting line made of the first conductive layer, the middle line may be connected to a second short bar made of the second conductive layer through a second connecting line made of the second conductive layer, and a line on another side of the middle line may be connected to a third short bar made of the first conductive layer through a first connecting portion of a third connecting line made of the second conductive layer, and a second connecting portion of the third connecting line made of a third conductive layer provided on a second insulating layer covering the second conductive layer.

In this case, it is possible to appropriately connect the corresponding data lines or scan lines while making the area where the first to third short bars are disposed small.

Also, in the active matrix substrate, it is preferable that the middle line be connected to the second connecting line at an electrode terminal provided on a tip of an end portion of a corresponding data line or a tip of an end portion of a corresponding scan line, the electrode terminal being connected to an electrode of a driver that drives the corresponding data line or scan line, and that the line on another side of the middle line be connected to the first connecting portion of the third connecting line at an electrode terminal provided on a tip of an end portion of a corresponding data line or a tip of an end portion of a corresponding scan line, the electrode terminal being connected to an electrode of a driver that drives the corresponding data line or scan line.

In this case, it is possible to connect the corresponding data lines or scan lines to the to the driver with ease while making the respective wiring areas of the second connecting line and the third connecting line small.

Also, in the active matrix substrate, it is preferable that, in the third connecting line, the first connecting portion and the second connecting portion be connected to each other over the first short bar.

In this case, it is possible to make the wiring area of the third connecting line smaller.

Also, in the active matrix substrate, among end portions of the data lines or end portions of the scan lines, end portions of adjacent two lines may be respectively made of the first conductive layer and the second conductive layer, among four adjacent lines of the data lines or the scan lines, a first line made of the first conductive layer may be connected to a first short bar made of the first conductive layer through a first connecting line made of the first conductive layer, a third line made of the second conductive layer may be adjacent to the first line and may be connected to a third short bar made of the first conductive layer through a first connecting portion of a third connecting line made of the second conductive layer, and a second connecting portion of the third connecting line made of a third conductive layer provided on a second insulating layer covering the second conductive layer, a second line made of the first conductive layer may be adjacent to the third line and may be connected to a second short bar made of the second conductive layer through a second connecting line made of the second conductive layer, and a fourth line made of the second conductive layer may be adjacent to the second line and may be connected to a fourth short bar made of the second conductive layer through a first connecting portion of a fourth connecting line made of the second conductive layer, and a second connecting portion of the fourth connecting line made of a third conductive layer.

In this case, it is possible to appropriately connect the corresponding data lines or scan lines to the first to fourth short bars while making the area where the first to fourth short bars are disposed small.

Also, in the active matrix substrate, it is preferable that the second line be connected to the second connecting line at an electrode terminal provided on a tip of an end portion of a corresponding data line or a tip of an end portion of a corresponding scan line, the electrode terminal being connected to an electrode of a driver that drives the corresponding data line or scan line.

In this case, it is possible to make the wiring area of the second connecting line small and to connect the corresponding data lines or scan lines to the driver with ease.

Also, in the active matrix substrate, it is preferable that, in the third connecting line and the fourth connecting line, the respective first connecting portion and second connecting portion be connected to each other over the first short bar.

In this case, it is possible to make the wiring area of the third connecting line and the fourth connecting line smaller.

Also, in the active matrix substrate, end portions of the data lines or end portions of the scan lines may be made of the first conductive layer, among three adjacent lines of the data lines or the scan lines, a line on one side of a middle line may be connected to a first short bar made of the second conductive layer through a first connecting portion of a first connecting line made of the first conductive layer, and a second connecting portion of the first connecting line made of the second conductive layer, the middle line may be connected to a second short bar made of the first conductive layer through a second connecting line made of the first conductive layer, and a line on another side of the middle line may be connected to a third short bar made of the second conductive layer through a first connecting portion of a third connecting line made of the first conductive layer, and a second connecting portion of the third connecting line made of a third conductive layer provided on a second insulating layer covering the second conductive layer.

In this case, it is possible to appropriately connect the corresponding data lines or scan lines to the first to third short bars while making the area where the first to third short bars are disposed small.

Also, in the active matrix substrate, it is preferable that thin film transistors and pixel electrodes connected to the thin film transistors be included, and that the pixel electrodes be made of the third conductive layer.

In this case, it is possible to make a structurally simple active matrix substrate with ease without an increase in manufacturing steps.

The display device of the present invention uses any of the active matrix substrates above, wherein the data lines or the scan lines are separated from the at least three short bars.

In the display device configured as described above, a compact active matrix substrate in which it is possible to reduce the area where the short bars are disposed is used, and thus, it is possible to miniaturize the display device with ease.

Effects of the Invention

According to the present invention, it is possible to provide a compact active matrix substrate in which it is possible to reduce the area of the short bar, and a display device using this.

DETAILED DESCRIPTION OF EMBODIMENTS

Below, preferred embodiments of an active matrix substrate and a display device of the present invention will be described with reference to figures. In the descriptions below, an example of using the present invention for a transmissive liquid crystal display device will be explained. The dimensions of constituting members in respective figures do not truthfully represent the dimensions of actual constituting members, dimensional ratios of the respective constituting members, or the like.

(Embodiment 1)

Figure 1:
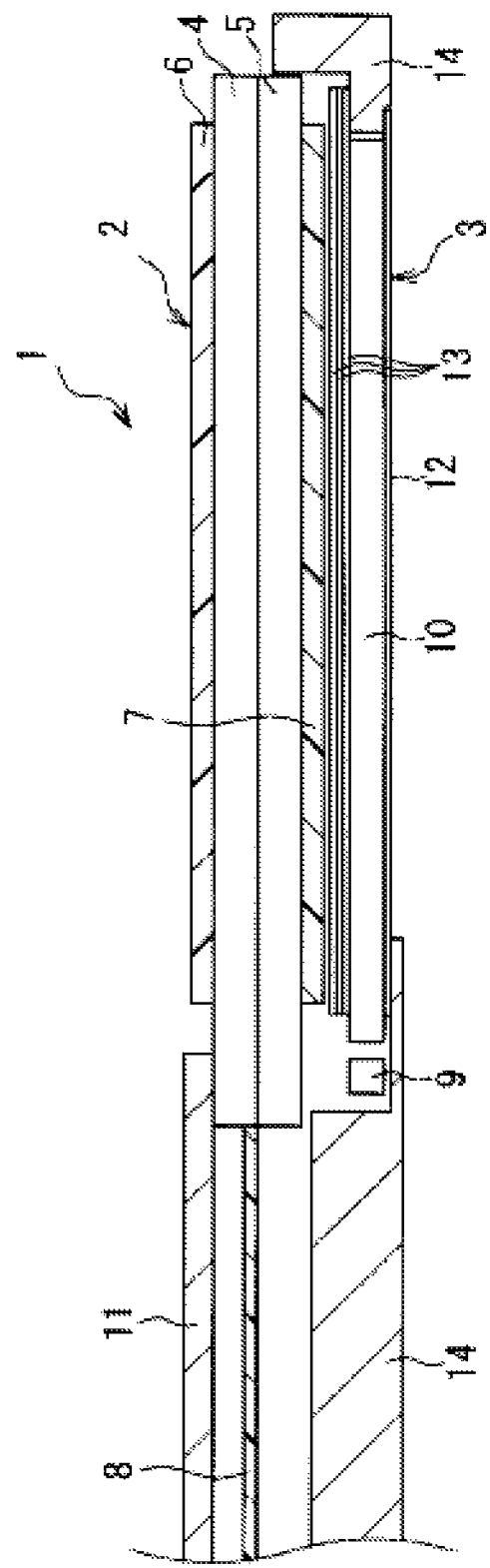
FIG. 1 is a view showing a liquid crystal display device according to Embodiment 1 of the present invention.

FIG. 1 is a view showing a liquid crystal display device according to Embodiment 1 of the present invention. In FIG. 1, the liquid crystal display device 1 of the present embodiment includes a liquid crystal panel 2 disposed with the upper side of FIG. 1 as the viewer side (display surface side), and a backlight device 3 disposed on the non-display side (lower side in FIG. 1) of the liquid crystal panel 2, the backlight device 3 emitting illumination light that illuminates the liquid crystal panel 2.

The liquid crystal panel 2 includes a color filter substrate 4 and an active matrix substrate 5 of the present invention, which constitute a pair of substrates, and polarizing plates 6 and 7 provided on the respective outer surfaces of the color filter substrate 4 and the active matrix substrate 5. A liquid crystal layer to be mentioned later is interposed between the color filter substrate 4 and the active matrix substrate 5. A plate-like transparent glass material or a transparent synthetic resin such as an acrylic resin is used for the color filter substrate 4 and the active matrix substrate 5. A resin film such as TAC (triacetyl cellulose) or PVA (polyvinyl alcohol) is used in the polarizing plates 6 and 7, and the polarizing plates 6 and 7 are bonded to the corresponding color filter substrate 4 or active matrix substrate 5 so as to cover at least an active display region of the display surface provided in the liquid crystal panel 2.

The active matrix substrate 5 is one of the pair of substrates described above, and the pixel electrodes, thin-film transistors (TFT), and the like are formed between the liquid crystal layer and the active matrix substrate 5 for each of the plurality of the pixels included in the display surface of the liquid crystal panel 2 (explained in detail later). On the other hand, the color filter substrate 4 is the other substrate (opposite substrate) of the pair substrates, and color filters, a common electrode, and the like to be described later are formed on the color filter substrate 4, between the color filter substrate 4 and the liquid crystal layer.

Also, in the liquid crystal panel 2, an FPC (flexible printed circuit) 8 connected to a control device (not shown in drawings) that performs drive control in the liquid crystal panel 2 is provided, and by operating the liquid crystal layer for each pixel unit, the display surface is driven on the pixel unit, thus display a desired image on the display surface.

The liquid crystal mode and pixel structure of the liquid crystal panel 2 are to be chosen as appropriate. The drive mode of the liquid crystal panel 2 is also to be chosen as appropriate. In other words, an appropriate liquid crystal panel that is capable of displaying information can be used as the liquid crystal panel 2. Thus, a detailed structure of the liquid crystal panel 2 in FIG. 1 is not shown, and descriptions thereof will be omitted.

The backlight device 3 has light-emitting diodes 9 as a light source, and a light guide plate 10 arranged facing these light-emitting diodes 9. A bezel 14 that has an "L"-shaped cross-section holds the light-emitting diodes 9 and the light guide plate 10 with the liquid crystal panel 2 placed above the light guide plate 10 in the backlight device 3. A case 11 is placed on the color filter 4. As a result, the backlight device 3 is attached to the liquid crystal panel 2, and thus, a transmissive liquid crystal display device 1 in which light from the backlight device 3 is incident on the liquid crystal panel 2 is integrally formed.

A transparent synthetic resin such as an acrylic resin is used for the light guide plate 10, for example, and light from the light-emitting diodes 9 enters the light guide plate 10. A reflective sheet 12 is arranged on the side of the light guide plate 10 opposite to (opposing) the liquid crystal panel 2. On the liquid crystal panel 2 side of the light guide plate 10 (light-emitting surface side), optical sheets 13 such as a lens sheet and a diffusion sheet are provided, and light from the light-emitting diodes 9 guided in a prescribed light guide direction (left to right direction in FIG. 1) within the light guide plate 10 is converted into the illumination light that is planar and has an even brightness, and then supplied to the liquid crystal panel 2.

In the description above, a configuration was described in which an edge-lit backlight device 3 having a light guide plate 10 is used, but the present embodiment is not limited to this, and a direct-lit backlight device may also be used. A backlight device having a light source other than a light-emitting diode such as a cold cathode fluorescent tube or a hot cathode fluorescent tube can be used.

Next, with reference to FIGS. 2 and 3, the liquid crystal panel 2 of the present embodiment will be described in detail.

Figure 2:
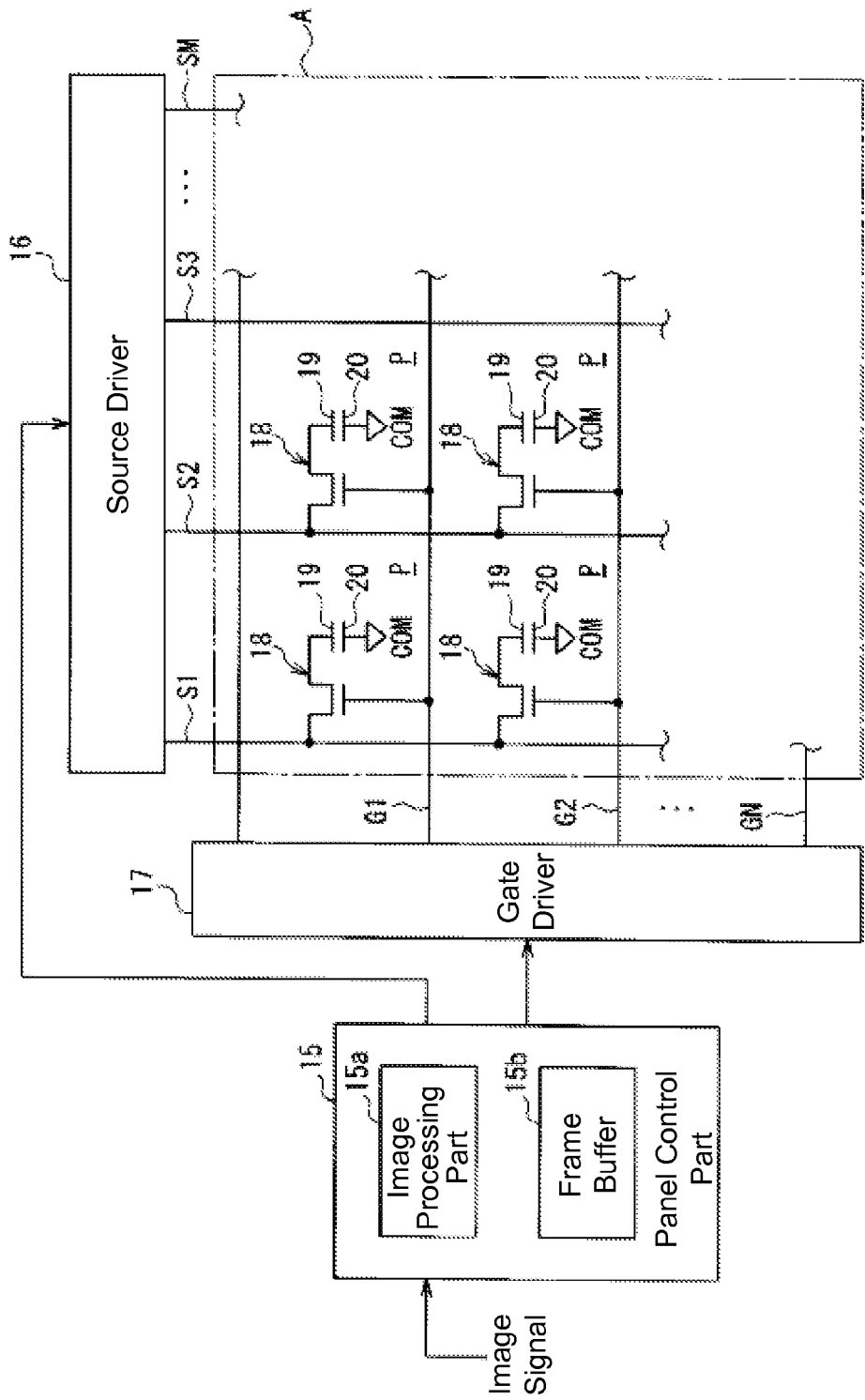
FIG. 2 is a view showing a configuration of the liquid crystal panel shown in FIG. 1.

FIG. 2 is a view describing a configuration of the liquid crystal panel shown in FIG. 1. FIG. 3 is a cross-sectional view of a configuration of main components of the liquid crystal panel.

In FIG. 2, the liquid crystal display device 1 (FIG. 1) is provided with a panel control part 15 that performs drive control of the liquid crystal panel 2 (FIG. 1) as the display part that displays data such as characters and images, and a source driver 16 and a gate driver 17 that operate based on command signals from the panel control part 15.

The panel control part 15 is provided inside the control device, and image signals from outside the liquid crystal display device 1 are inputted to the panel control part 15. The panel control part 15 includes an image processing part 15a that performs a prescribed image processing to an inputted image signal and generates respective command signals to the source driver 16 and the gate driver 17, and a frame buffer 15b that can store one frame of image data included in the inputted image signal. The panel control part 15 controls driving of the source driver 16 and gate driver 17 in accordance with the inputted image signals in order to display the information for the image signals on the liquid crystal panel 2.

The source driver 16 and the gate driver 17 are disposed on the active matrix substrate 5. Specifically, the source driver 16 is placed on the surface of the active matrix substrate 5 along the horizontal direction of the liquid crystal panel 2, in an area outside the active display area A of the liquid crystal panel 2, which is a display panel. The gate driver 17 is placed on the surface of the active matrix substrate 5 along the vertical direction of the liquid crystal panel 2, in an area outside the active display area A. As will be described below, as the gate driver 17, a configuration in which the gate driver is split in two so as to sandwich the active display area A may be used, or the gate driver 17 may be disposed along the horizontal direction of the liquid crystal panel 2.

Also, the source driver 16 and the gate driver 17 are driver circuits that drive the plurality of pixels P provided on the liquid crystal panel 2 per pixel unit, and the source driver 16 and the gate driver 17 are respectively connected to a plurality of source lines S1 to SM (M being an integer of at least two; hereinafter referred to as "S") and a plurality of gate lines G1 to GN (N being an integer of at least two; hereinafter referred to as "G"). These source lines S and gate lines G respectively constitute data lines and scan lines, and are arranged in a matrix so as to intersect with each other on a transparent glass or transparent synthetic resin base member to be described below included in the active matrix substrate 5. In other words, the source lines S are arranged on the base substrate so as to be parallel with the column direction (the vertical direction of the liquid crystal panel 2) of the matrix, and the gate lines G are arranged on the base member so as to be parallel with the row direction (the horizontal direction of the liquid crystal panel 2) of the matrix.

In the vicinity of the intersections of the source lines S and gate lines G, the pixels P having thin film transistors 18 as switching elements and pixel electrodes 19 connected to the thin film transistors 18 are provided. A common electrode 20 opposes the pixel electrode 19 in each pixel P while sandwiching therebetween the liquid crystal layer provided on the liquid crystal panel 2. In other words, the thin film transistor 18, pixel electrode 19, and common electrode 20 are provided for each pixel in the active matrix substrate 5.

On the active matrix substrate 5, a plurality of pixel P regions are formed in the respective regions divided in a matrix by the source lines S and the gate lines G. Red (R), green (G), and blue (B) pixels are included among these plurality of pixels P. Also, these RGB pixels are sequentially arranged in this order, for example, in parallel with the respective gate lines G1 to GN. These RGB pixels are able to perform display of the corresponding color due to color filter layers to be described layer (not shown) provided on the color filter substrate 4 side.

Also, in the active matrix substrate 5, the gate driver 17 sequentially outputs a scan signal (gate signal) that turns ON gate electrodes of the corresponding thin film transistors 18 to the gate lines G1 to GN based on a command signal from the image processing part 15a. The source driver 16 outputs a data signal (voltage signal (gradation voltage)) based on the brightness (gradation) of the displayed image to the corresponding source lines S1 to SM based on a command signal from the image processing part 15a.

Figure 3:
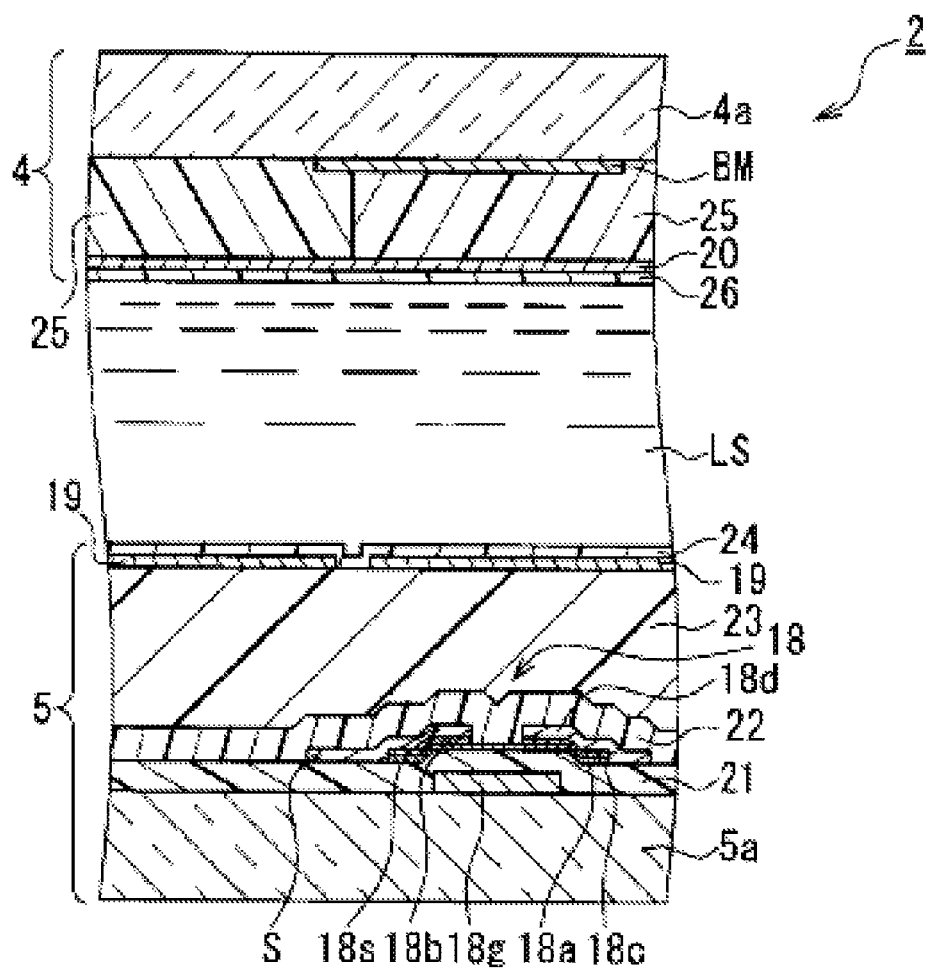
FIG. 3 is a cross-sectional view of a configuration of main components of the liquid crystal panel.

As shown in an example in FIG. 3, in the active matrix substrate 5, in the vicinity of the thin film transistor 18, a source line (data line) S and a gate electrode 18g, and a gate insulating film 21 formed so as to cover the gate electrode 18g are formed on the base member 5a of the active matrix substrate 5. In addition, above the gate insulating film 21, a semiconductor layer 18a of the thin film transistor 18, contact layers 18b and 18c, a source electrode 18s and a drain electrode 18d, a protective insulating film 22, an interlayer insulating film 23, a pixel electrode 19, and an alignment film 24 are sequentially layered.

Also, on the color filter substrate 4, a black matrix BM, a color filter layer 25 of any of the RGB colors, and a color filter layer 25' of an adjacent pixel P are formed on the base member 4a of the color filter substrate 4. Also, the common electrode 20 and an alignment film 26 are sequentially layered on the color filter layers 25 and 25' of different colors. The liquid crystal layer LS is sealed between the alignment film 24 and the alignment film 26.

Next, the main components of the active matrix substrate 5 of the present embodiment will be described in detail with reference to FIGS. 4 and 5.

Figure 4:
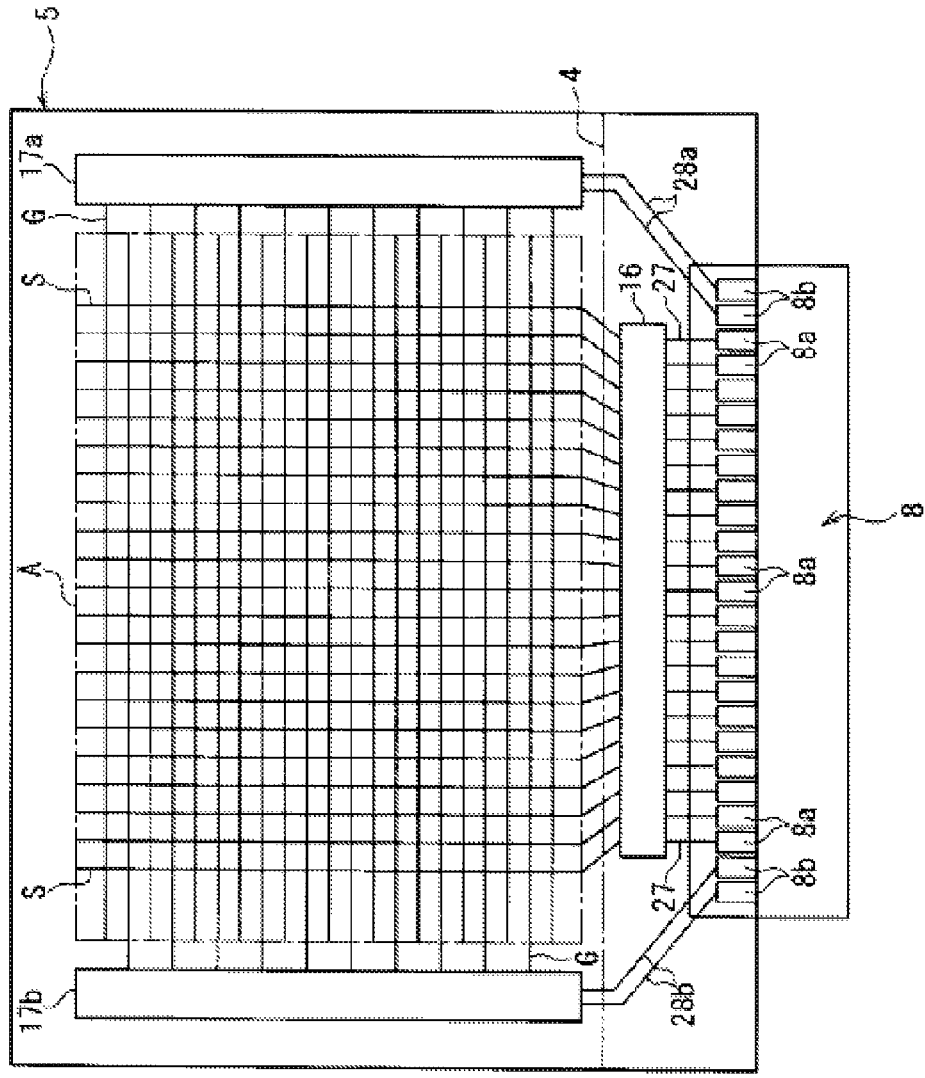
FIG. 4 is a view showing main components of the active matrix substrate shown in FIG. 1.

FIG. 4 is a view showing main components of the active matrix substrate shown in FIG. 1. FIG. 5 is a view showing a source driver mounting region and a connecting portion of an FPC in the active matrix substrate.

As shown in FIG. 4, on the active matrix substrate 5, the plurality of source lines (data lines) S and the plurality of gate lines (scan lines) G are arranged in a matrix in the portion of the active matrix substrate 5 covered by the color filter substrate 4. As shown with the one-dot chain line in FIG. 4, the active display area A is provided.

The source driver 16 is constituted of an IC, for example, and is mounted on the base member 5a of the active matrix substrate 5 outside the active display area A. Also, the source driver 16 is connected to the FPC connecting terminals 8a of the FPC 8 through wiring lines 27, and command signals from the image processing part 15a are inputted through the FPC 8.

The gate drivers 17a and 17b are formed monolithically on the base member 5a of the active matrix substrate 5 so as to sandwich the active display area A. These gate drivers 17a and 17b are connected to a plurality of gate lines G alternately. These gate drivers 17a and 17b are connected to the FPC connecting terminals 8b of the FPC 8 respectively through wiring lines 28a and 28b, and a command signal is inputted from the image processing part 15a through the FPC 8. Besides what is described, the gate drivers 17a and 17b may be connected to the same gate lines G, or a gate driver may be provided only on one side of the active display area A. Also, the gate drivers 17a and 17b constituted of ICs may be mounted on the base member 5a.

Figure 5:
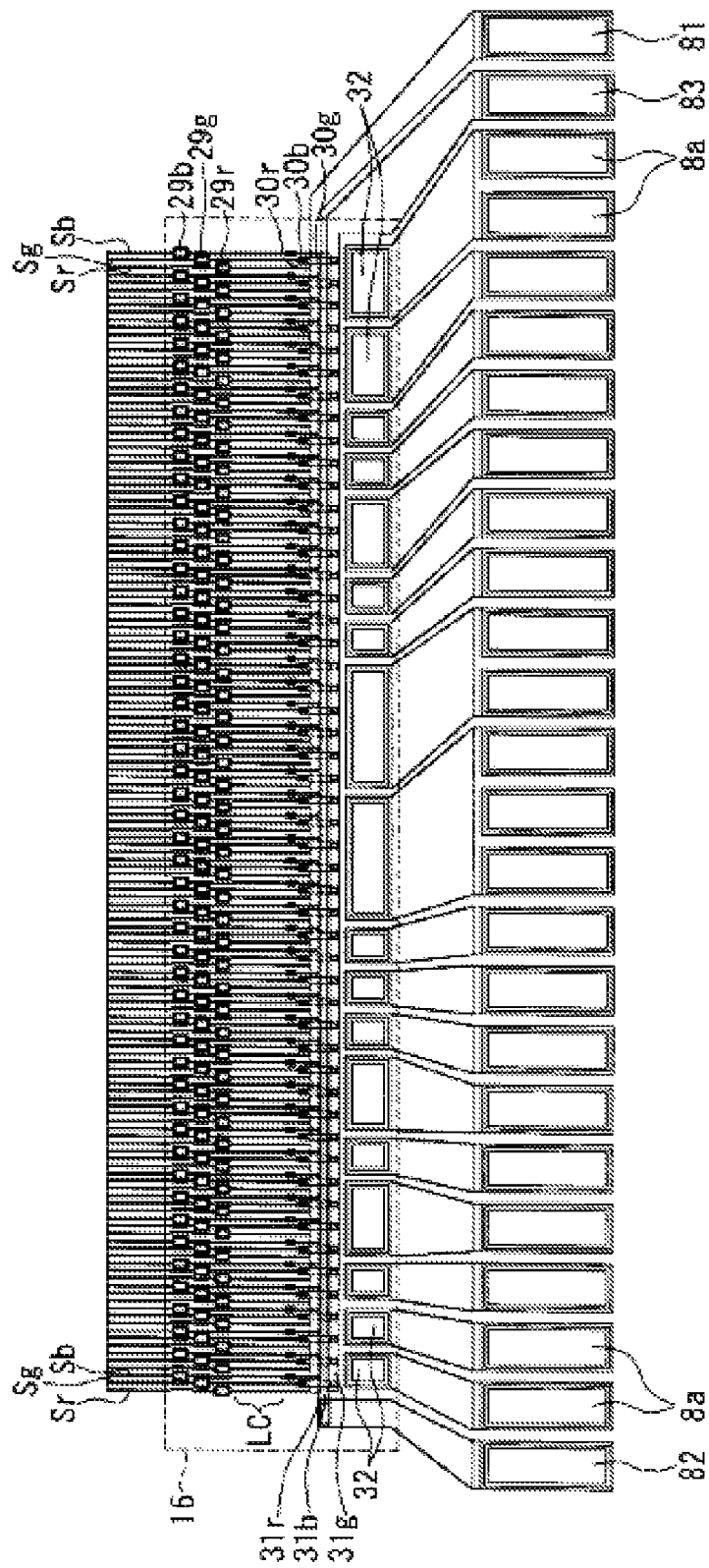
FIG. 5 is a view showing a source driver mounting region and a connecting portion of an FPC in the active matrix substrate.

Also, as shown in FIG. 5, in the active matrix substrate 5 of the present embodiment, a total of three first, second, and third short bars 31r, 31b, and 31g are provided for the source lines S in a direction perpendicular thereto and a direction parallel thereto for each color RGB, for example. The first, second, and third short bars 31r, 31b, and 31g are respectively connected to corresponding RGB color source lines Sr, Sb, and Sg, respectively through electrode terminals 29r, 29b, and 29g, and first, second, and third connecting lines 30r, 30b, and 30g. In the process of manufacturing the active matrix substrate 5, the first, second, and third short bars 31r, 31b, and 31g are provided in order to perform testing or anti-static processes on the connected source lines S. The first, second, and third short bars 31r, 31b, and 31g have connected thereto a prescribed number of source lines Sr, Sb, and Sg of corresponding colors, and also have connected thereto test signal input terminals 81, 82, and 83 for inputting test signals.

Additionally, in the first, second, and third short bars 31r, 31b, and 31g, as will be described below, on the base member 5a of the active matrix substrate 5, the second short bar 31b in the center is in a different layer than the first and third short bars 31r and 31g on either side thereof. Moreover, the edges of the second short bar 31b in the center and the edges of the first and third short bars 31r and 31g on either side overlap each other (details below).

Also, on the active matrix substrate 5, a source driver 16 is mounted as shown with the dotted line in FIG. 5. In other words, the electrode terminals 29r, 29b, and 29g are connected to output electrodes (not shown in drawings) provided in the source driver 16, and command signals (drive signals) are outputted to the respective source lines S. Input electrodes (not shown in drawings) provided in the source driver 16 are connected to the driver input terminal 32, and command signals from the image processing part 15a are inputted to the source driver 16 through the FPC connecting terminal 8a of the FPC 8 and the driver input terminal 32.

As shown with "LC" in FIG. 5, in the active matrix substrate 5, a laser-cut region that is cut by laser-cutting is provided at an end portion of the source lines S. In other words, in the active matrix substrate 5, before the source driver 16 is mounted on the base member 5a, the ends of the source lines S are laser-cut, and separated from the first to third short bars 31r, 31b, and 31g.

Next, with reference to FIGS. 6 to 10, the configuration of main components of the active matrix substrate 5 of the present embodiment will be described in detail.

Figure 6:
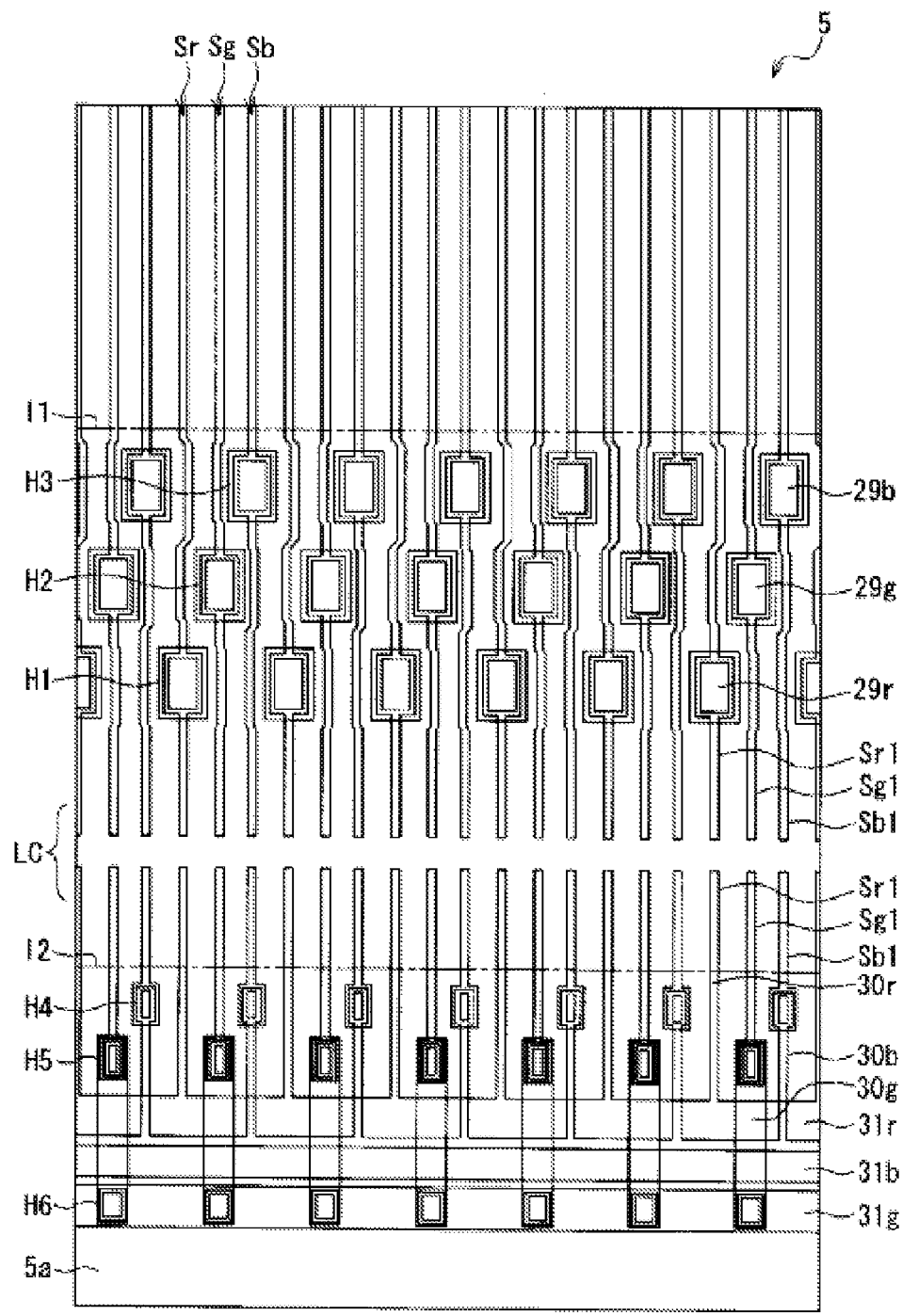
FIG. 6 is a view showing a configuration of main components of the active matrix substrate after laser-cutting has been performed thereon.
Figure 7:
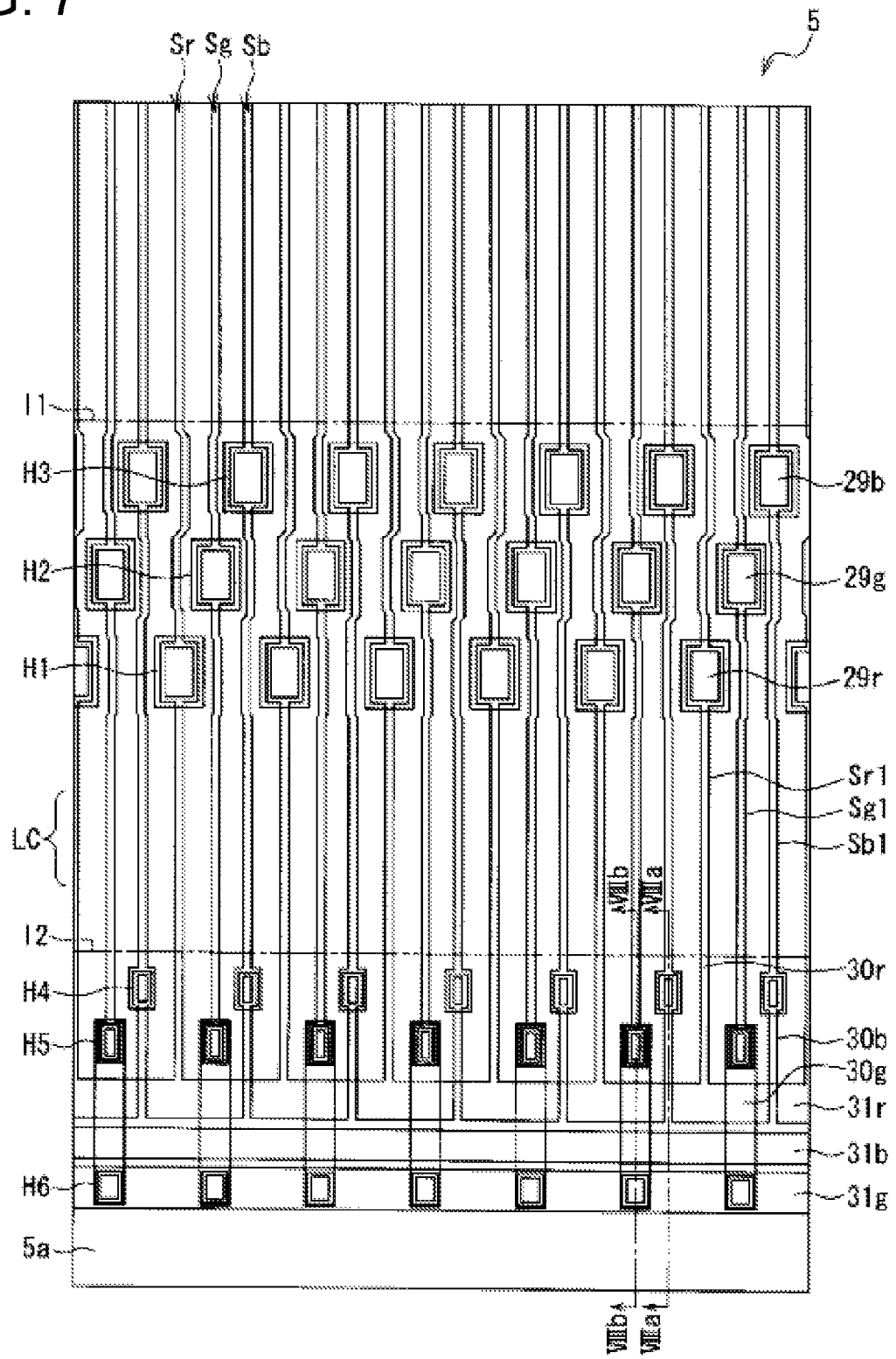
FIG. 7 is a view showing main components of the active matrix substrate before laser-cutting has been performed thereon.
Figure 8:
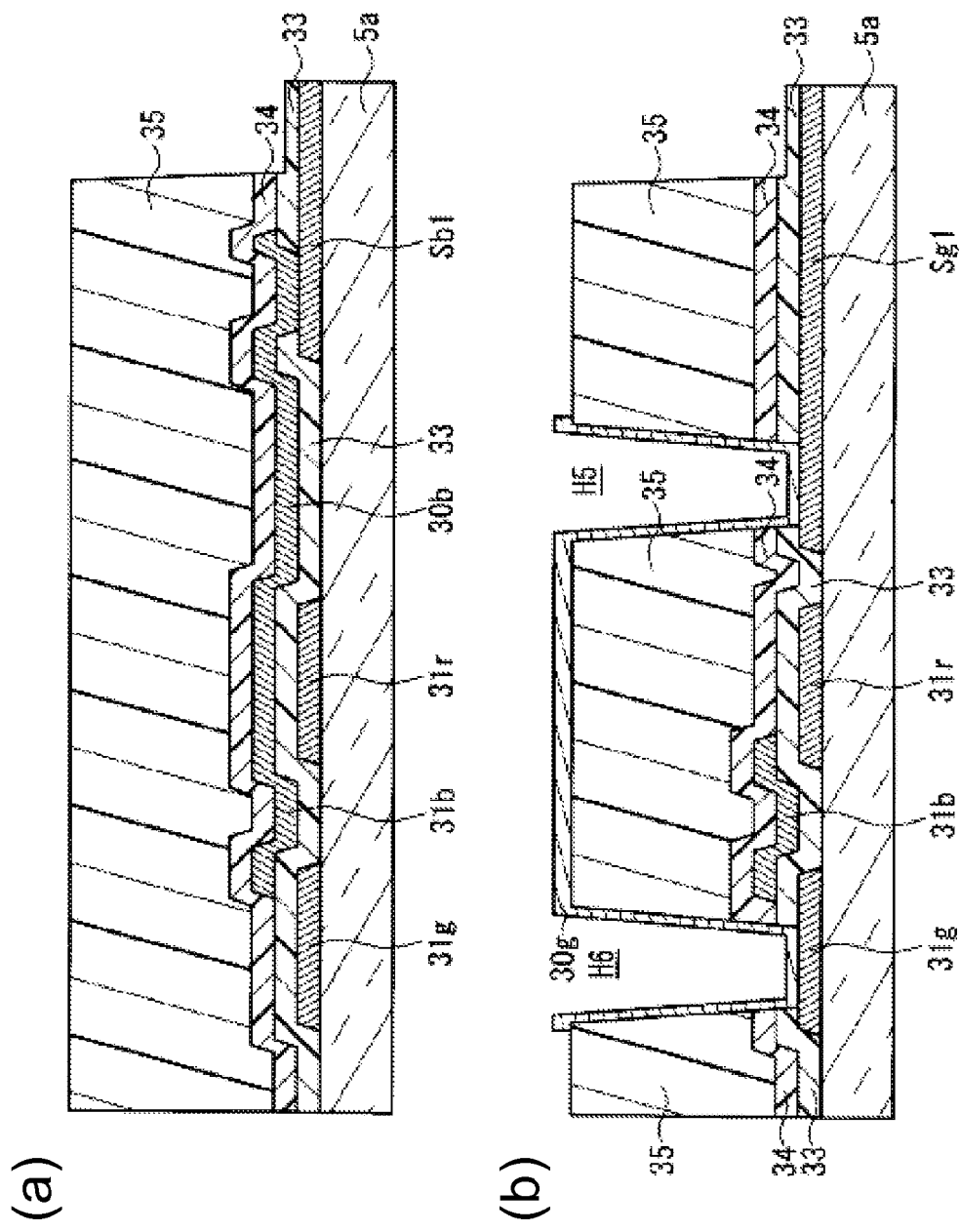
FIG. 8(a) is a cross-sectional view of FIG. 7 along the line VIIIa-VIIIa.
FIG. 8(b) is a cross-sectional view of FIG. 7 along the line VIIIb-VIIIb.

FIG. 6 is a view that describes a configuration of main components of the active matrix substrate after being laser-cut. FIG. 7 is a view that describes a configuration of main components of the active matrix substrate before being laser-cut. FIG. 8(a) is a cross-sectional view of FIG. 7 along the line VIIIa-VIIIa, and FIG. 8(b) is a cross-sectional view of FIG. 7 along the line VIIIb-VIIIb. FIGS. 9(a) and 9(b) are views that describe a configuration of the gate layer and the source layer, respectively, of the configuration of main components of the active matrix substrate shown in FIG. 7. FIGS. 10(a) and 10(b) are views that describe a configuration of the interlayer insulating film and the protective insulating film and a configuration of the pixel electrode layer, among the configuration of main components of the active matrix substrate shown in FIG. 7.

As shown in FIG. 6, in the active matrix substrate 5 of the present embodiment, source lines Sr, Sb, and Sg corresponding respectively to the RGB colors are sequentially arranged along the left to right direction of the drawing. Of these source lines Sr, Sb, and Sg, the ends Sr1, Sg1, and Sb1 thereof are cut at a laser-cut region LC.

Also, in the active matrix substrate 5 of the present embodiment, portions of the source lines Sr, Sb, and Sg shown in FIG. 6, or in other words, the portions thereof drawn towards the outside of the active display area A, are made of a first conductive layer provided on the base member 5a. This first conductive layer is made of the same metal (a plurality of types of metal formed in one layer or multiple layers) as the gate electrode 18g shown in FIG. 3, and formed on the base member 5a in the same manufacturing step, and is therefore also referred to as the gate layer.

On the other hand, portions of the source lines Sr, Sb, and Sg within the active display area A are made of a second conductive layer provided on the gate insulating film 33 (FIG. 8) as a first insulating layer covering the first conductive layer. This second conductive layer made of the same metal (a plurality of types of metal formed in one layer or multiple layers) as the source electrode 18s and the drain electrode 18d shown in FIG. 3 and formed in the same step over the base member 5a, and is therefore also referred to as the source layer.

Also, in the active matrix substrate 5 of the present embodiment, a third conductive layer is provided on the protective insulating film 34 (FIG. 8) and the interlayer insulating film 35 (FIG. 8) as the second insulating layer covering the second conductive layer. The third conductive layer is made of the same conductive material (an ITO film or an IZO film, for example) as the pixel electrode 19 shown in FIG. 3 and formed in the same manufacturing step over the base member 5a, and is therefore also referred to as the pixel electrode layer.

In the active matrix substrate 5 of the present embodiment, the gate insulating film 33, the protective insulating film 34, and the interlayer insulating film 35 are provided in the portion between the upper edge of FIG. 6 and the one dot chain line I1 and the portion between the one dot chain line I2 and the bottom edge of FIG. 6. On the other hand, in the portion between the one dot chain line I1 and the one dot chain line I2, the protective insulating film 34 and the interlayer insulating film 35 are not formed, and only the gate insulating film 33 is formed (refer to FIG. 10(a)).

Besides what was described, one insulating film among the protective interlayer insulating film 34 and the interlayer insulating film 35 may be provided below the third conductive layer. Also, the gate insulating film 33, the protective insulating film 34, and the interlayer insulating film 35 are made of the same material and formed in the same manufacturing step as the gate insulating film 21, the protective insulating film 22, and the interlayer insulating film 23 shown in FIG. 3, over the base member 5a.

In the active matrix substrate 5 of the present embodiment, portions of the source lines Sr, Sb, and Sg drawn outside of the active display area A are mainly constituted of the first conductive layer (gate layer), and thus, compared to a configuration in which they are constituted of the second conductive layer (source layer), it is possible to reduce physical damage and increase the margin to deal with corrosion.

As shown in FIGS. 7 to 10, in the active matrix substrate 5 of the present embodiment, the source lines Sr, Sb, and Sg are respectively connected to the electrode terminals 29r, 29b, and 29g made of the third conductive layer (pixel electrode layer) in contact holes H1, H2, and H3.

In the active matrix substrate 5 of the present embodiment, of the adjacent three source lines Sr, Sb, and Sg, an end portion Sr1 of the source line Sr on one side (left side of FIG. 7) is connected to the first short bar 31r made of the first conductive layer through the first connecting line 30r made of the first conductive layer (gate layer). Also, the end portion Sr1, the first connecting line 30r, and the first short bar 31r, as shown in FIG. 9(a), are made of the first conductive layer, and thus, are formed integrally with each other. Also, in FIG. 9(a), the end portion Sr1 is provided with a lower electrode Sr1a, which is configured to be connected to the electrode terminal part 29r in the contact hole H1.

Figure 9:
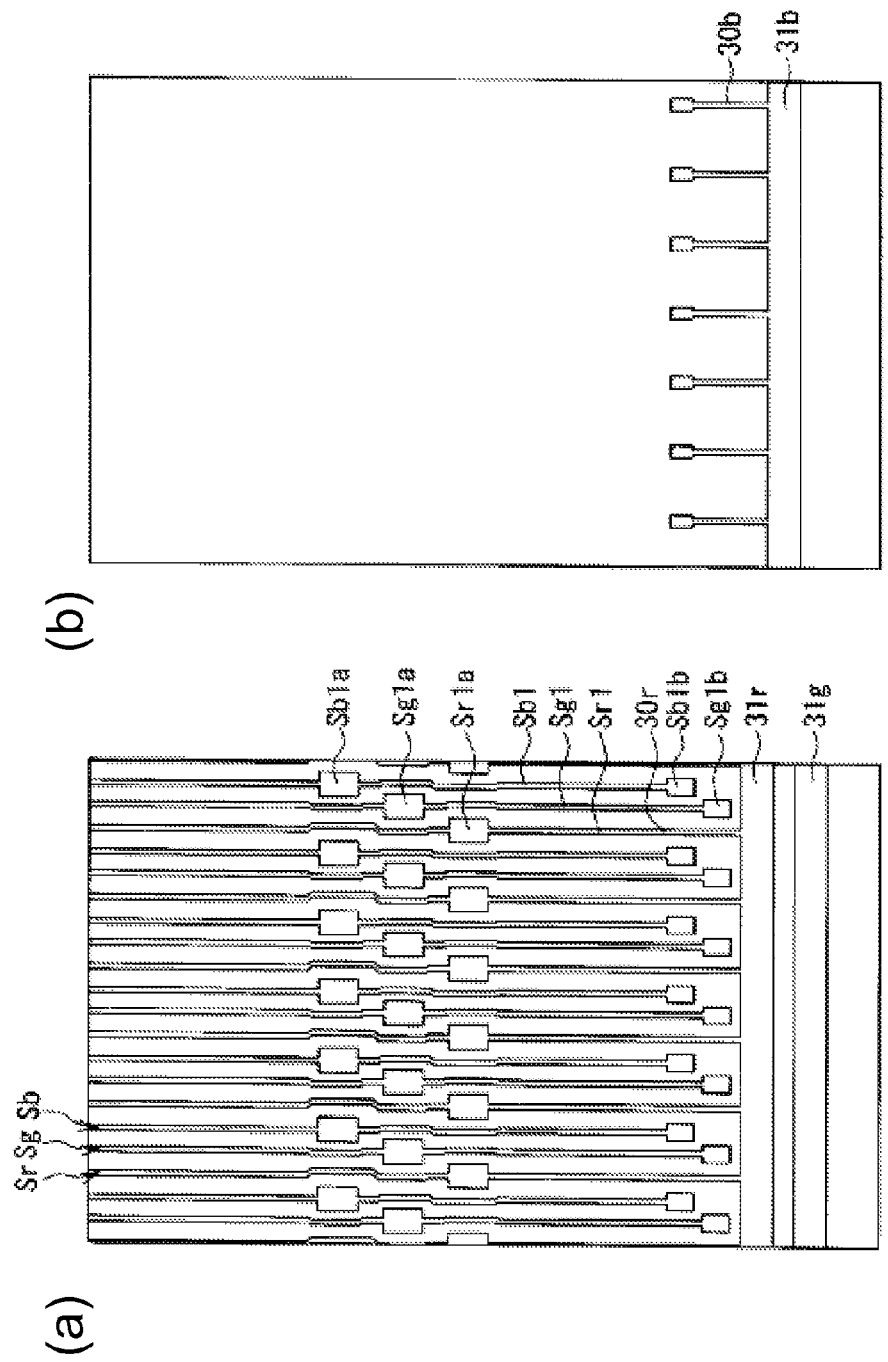
FIGS. 9(a) and 9(b) are views respectively showing a configuration of a gate layer and a configuration of a source layer among a configuration of main components of the active matrix substrate shown in FIG. 7.
Figure 10:
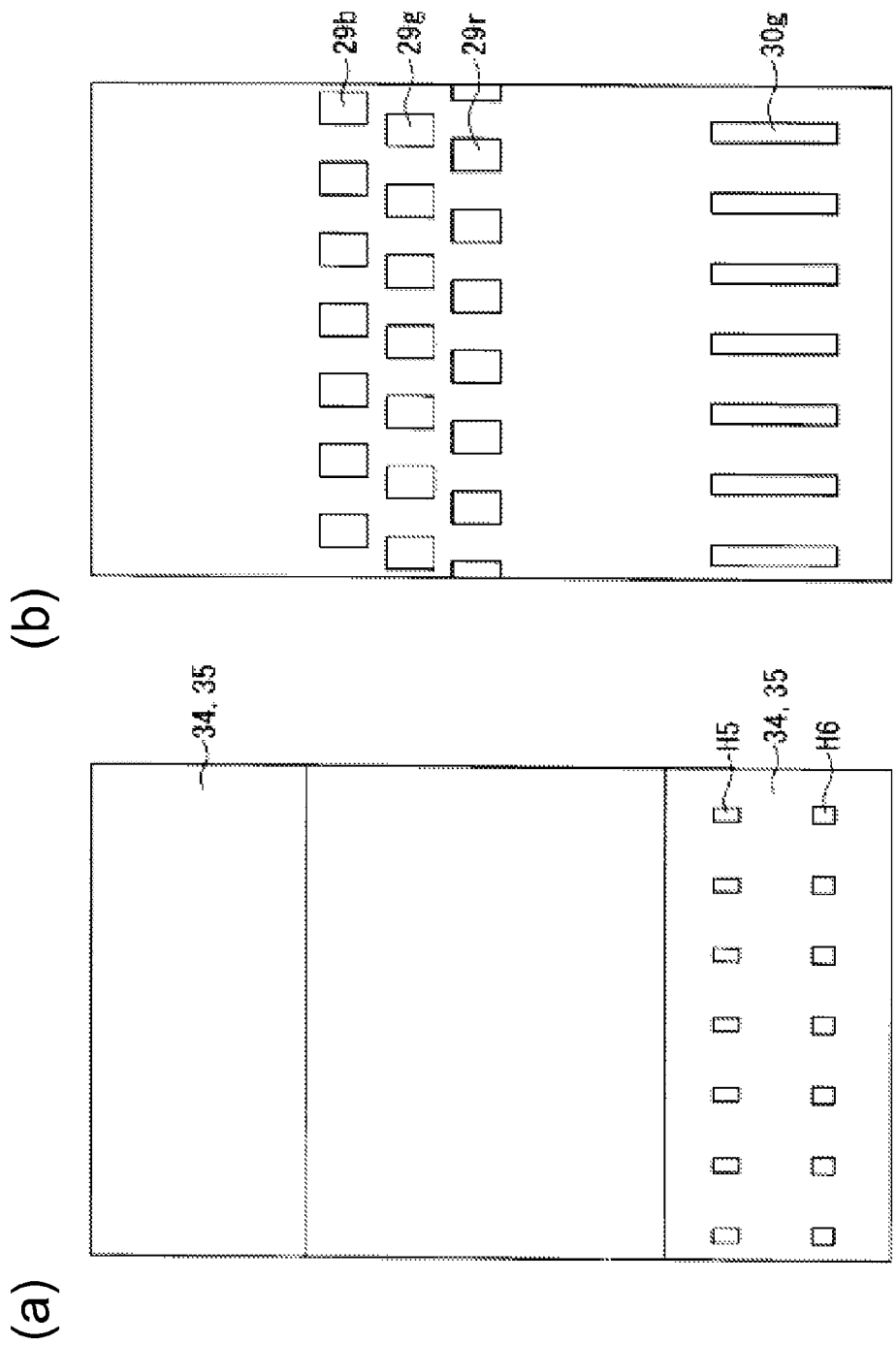
FIGS. 10(a) and 10(b) are views respectively showing a configuration of an interlayer insulating film and a protective insulating film and a configuration of a pixel electrode layer among a configuration of main components of the active matrix substrate shown in FIG. 7.

In the active matrix substrate 5 of the present embodiment, of the adjacent three source lines Sr, Sb, and Sg, the end portion Sb1 of the source line Sb on the other side (right side of FIG. 7) is connected to the second short bar 31b made of the second conductive layer through the second connecting line 30b made of the second conductive layer (source layer). Also, in FIG. 9(a), the end portion Sb1 is provided with a lower electrode Sb1a, which is configured to be connected to the electrode terminal part 29b in the contact hole H3. Also, the end portion Sb1 is provided with an electrode Sb1b on the tip thereof, and in the contact hole H4, the electrode Sb1b is connected to the end of the second connecting line 30b. Also, the second connecting line 30b and the second short bar 31b are, as shown in FIG. 9, made of the second conductive layer, and thus, are formed integrally with each other.

Also, in the active matrix substrate 5 of the present embodiment, of the adjacent three source lines Sr, Sb, and Sg, the end portion Sg1 of the middle source line Sg is connected to the third short bar 31g made of the first conductive layer through the third connecting line 30g made of the third conductive layer. Also, in FIG. 9(a), the end portion Sg1 is provided with a lower electrode Sg1a, which is configured to be connected to the electrode terminal 29g in the contact hole H2. The end portion Sg1 is provided with an electrode Sg1b on the tip thereof, and is connected to one end of the third connecting line 30g in the contact hole H5. The other end of the third connecting line 30g is connected to the third short bar 31g in the contact hole H6.

As shown in FIG. 8(b), in the active matrix substrate 5 of the present embodiment, among the first, second, and third short bars 31r, 31b, and 31g, the edges of the middle second short bar 31b and the edges of the first and third short bars 31r and 31g on either side are provided so as to overlap each other. In other words, in FIG. 8(b), the left side edge of the second short bar 31b and the right side edge of the third short bar 31g overlap each other, and the right side edge of the second short bar 31b and the left side edge of the first short bar 31r overlap each other.

In the active matrix substrate 5 of the present embodiment configured as described above, among the adjacent first, second, and third short bars 31r, 31b, and 31g, the middle second short bar 31b is made of the second conductive layer, and the first and third short bars 31r and 31g on either side are made of the first conductive layer. In this manner, in the present embodiment, it is possible to decrease the area taken up by the short bars and a compact active matrix substrate 5 can be made, unlike conventional examples. As a result, it is possible to form a large number of active matrix substrates from one motherboard with ease.

In the present embodiment, among the first, second, and third short bars 31r, 31b, and 31g, the edges of the middle second short bar 31b and the edges of the first and third short bars 31r and 31g on either side are provided so as to overlap each other. In this manner, in the present embodiment, it is possible to further decrease the area taken up by the short bars and a compact active matrix substrate 5 can be made with ease.

Specifically, if the width of the respective short bars is 20 μm, for example, and the gap between two adjacent short bars is 12 μm, for example, then in the conventional example, the width of the area where the three short bars are disposed would be 84 μm (20×3+12×2). By contrast, in the present embodiment, the width of the area where the three short bars are disposed can be made 52 μm (20×2+12×1), and thus, the area where the short bars are disposed can be made much smaller than in the conventional example.

Moreover, in the active matrix substrate 5 of the present embodiment, because it is possible to greatly reduce the size of the area where the short bars are disposed, it is possible to use a source driver 16 with a small external size, thus allowing the external size of the liquid crystal panel 2 to also be small. Also, it is possible to sufficiently secure a laser-cut region LC even if the external size of the source driver 16 is small, and thus, it is possible to mitigate the occurrence of defects such as loss of electrode terminals or the like in the laser-cutting step.

Also, in the active matrix substrate 5 of the present embodiment, the first and third short bars 31r and 31g are made of the first conductive layer (gate layer), and the second short bar 31b is made of the second conductive layer (source layer). As a result, in the active matrix substrate 5 of the present embodiment, it is possible to input test signals with ease to the source lines S compared to a case in which the respective short bars are made of a high resistance wiring material such as an ITO film, and it is possible to perform high precision testing with ease. A configuration is used in which test signals are inputted to the first, second, and third short bars 31r, 31b, and 31g through the test signal input terminals 81, 82, and 83, and thus, compared to a case in which test signals are inputted through high resistance elements such as TFTs, it is possible to input test signals with ease.

Also, in the active matrix substrate 5 of the present embodiment, source lines Sr, Sb, and Sg are respectively connected to the first, second, and third short bars 31r, 31b, and 31g through the first, second, and third connecting lines 30r, 30b, and 30g. As a result, it is possible to make the area where the first, second, and third short bars 31r, 31b, and 31g are disposed small while appropriately connecting the corresponding source lines Sr, Sb, and Sg to the first, second, and third short bars 31r, 31b, and 31g.

Also, in the active matrix substrate 5 of the present embodiment, the pixel electrodes 19 are made of the third conductive layer (pixel electrode layer), and thus, it is possible to form a structurally simple active matrix substrate 5 with ease without an increase in manufacturing steps.

Also, in the present embodiment, a compact active matrix substrate 5 in which the area where the short bars are disposed can be made small is used, and thus, it is possible to miniaturize the liquid crystal display device (display device) 1 with ease.

(Embodiment 2)

Figure 11:
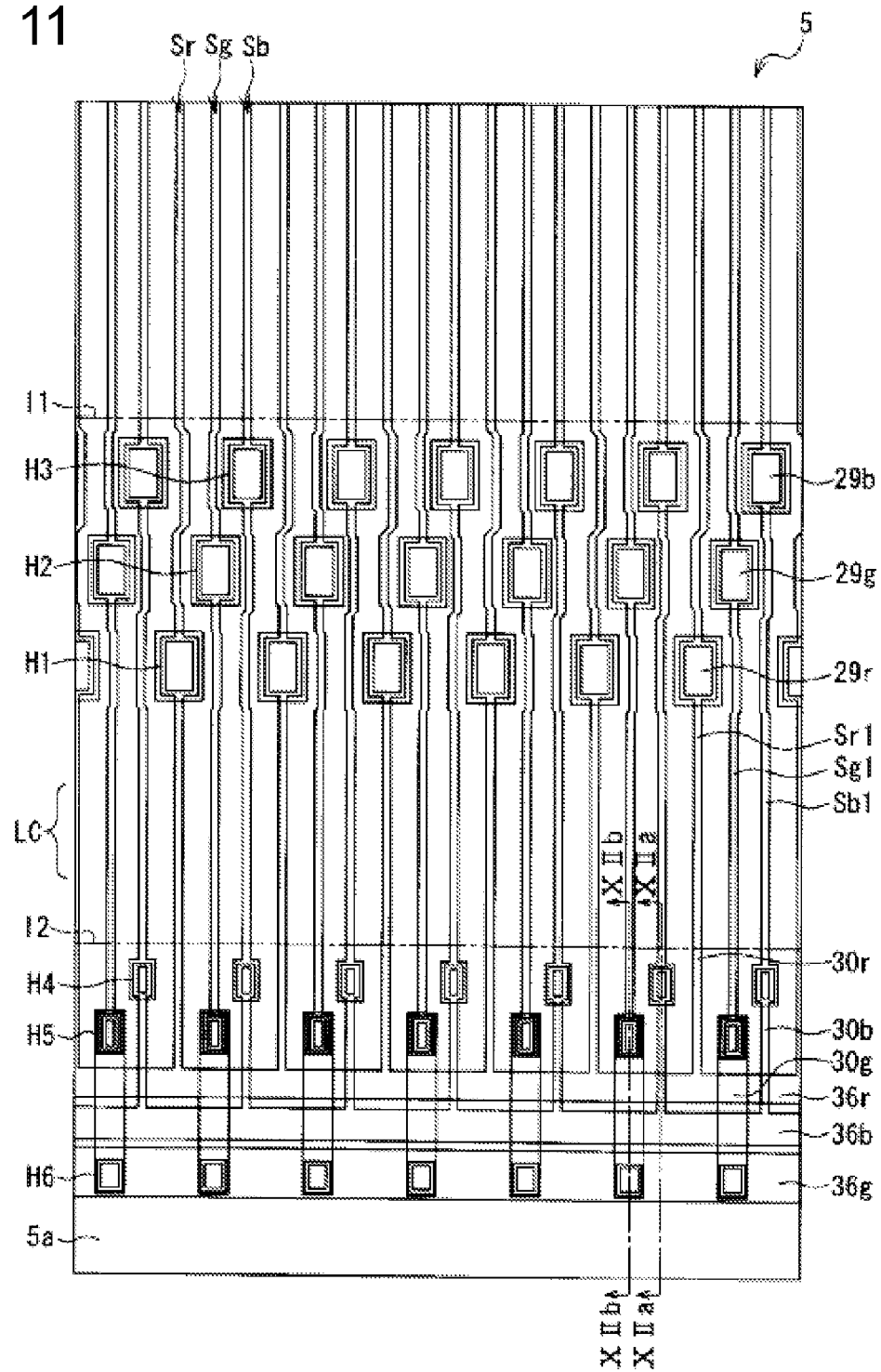
FIG. 11 is a view showing a configuration of main components of an active matrix substrate according to Embodiment 2 of the present invention before laser-cutting is performed thereon.
Figure 12:
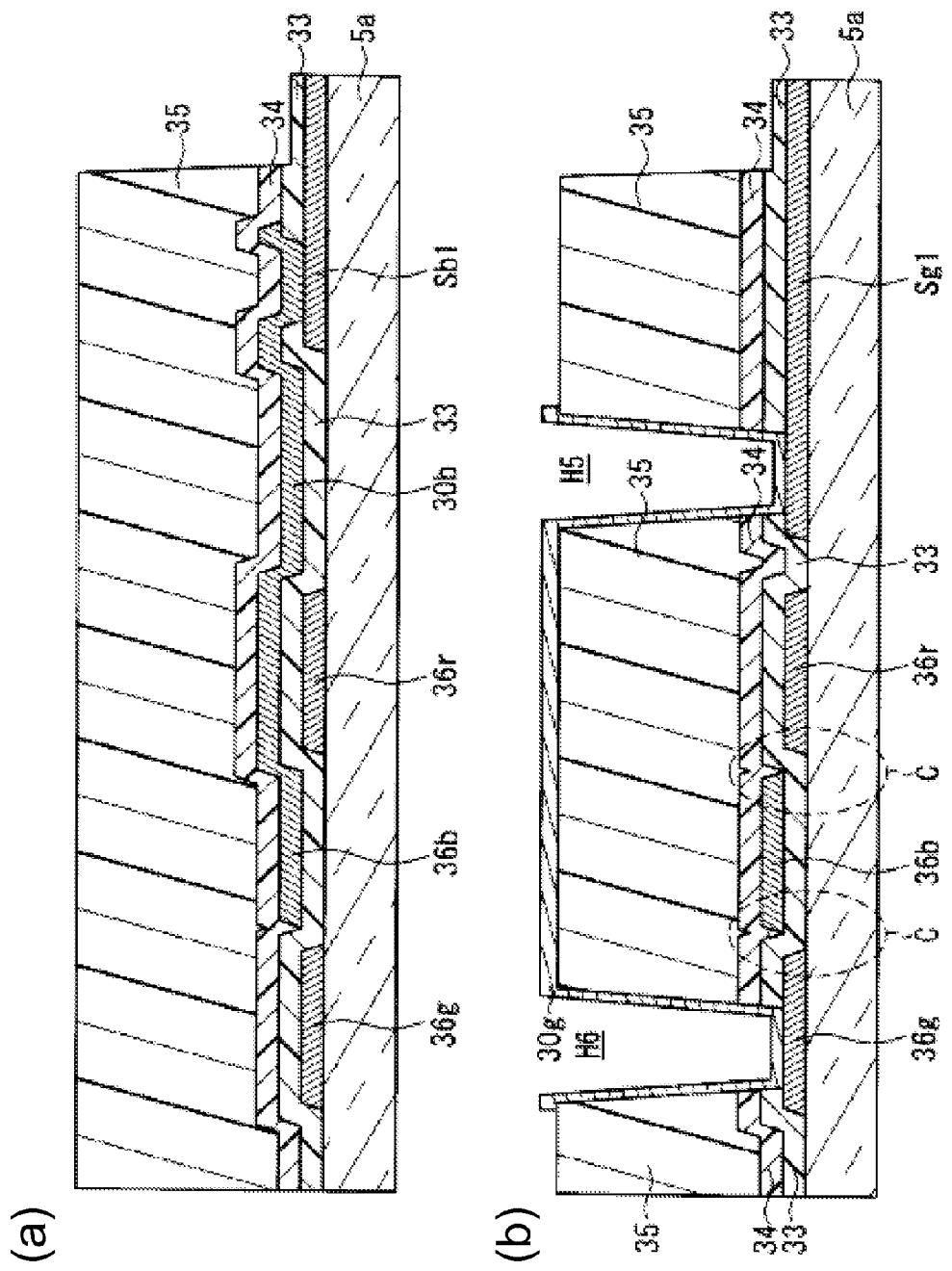
FIG. 12(a) is a cross-sectional view of FIG. 11 along the line XIIa-XIIa.
FIG. 12(b) is a cross-sectional view of FIG. 11 along the line XIIb-XIIb.

FIG. 11 is a view that describes the configuration of main components of an active matrix substrate according to Embodiment 2 of the present invention before laser-cutting is performed. FIG. 12(a) is a cross-sectional view of FIG. 11 along the line XIIa-XIIa, and FIG. 12(b) is a cross-sectional view of FIG. 11 along the line XIIb-XIIb. The main difference between the present embodiment and Embodiment 1 above in the drawings is that among adjacent first to third short bars, the middle second short bar and the first and third short bars on either side thereof do not overlap. The same reference characters are given to elements that are common with Embodiment 1 above, and duplicative descriptions are omitted.

In other words, in FIGS. 11, 12(a), and 12(b), in the active matrix substrate 5 of the present embodiment, among adjacent first, second, and third short bars 36r, 36b, and 36g, the middle second short bar 36b and the first and third short bars 36r and 36g on either side thereof do not overlap. Thus, as shown with "C" in FIG. 12(b), the left side edge of the second short bar 36b and the right side edge of the third short bar 36g do not overlap, and the right side edge of the second short bar 36b and the left side edge of the first short bar 36r do not overlap.

With the above-mentioned configuration, in the present embodiment, functions and effects similar to those in Embodiment 1 above can be achieved. Also, in the present embodiment, the second short bar 36b and the first and third short bars 36r and 36g do not overlap, and thus, parasitic capacitance that would result from such overlap does not occur among the first to third short bars 36r, 36g, and 36b. As a result, the line load on the first to third short bars 36r, 36g, and 36b can be prevented from becoming large, and even when signals are supplied to the respective first to third short bars 36r, 36g, and 36b, it is possible to mitigate delays in the signals.

Also, even if the second short bar 36b and the first and third short bars 36r and 36g do not overlap as described above, the second short bar 36b is made of the second conductive layer (source layer), and the first and third short bars 36r and 36g are made of the first conductive layer (gate layer), and thus, compared to conventional examples, it is possible to make the area where the short bars are disposed small. Specifically, if the width of the respective short bars is 20 μm, for example, then the gap between the second short bar 36b and the first short bar 36r or third short bar 36g can be set to 2 μm, and thus, the width of the area where the three short bars are provided can be set to 64 μm (20×3+2×2), and therefore, compared to conventional examples, it is possible to make the area where the short bars are disposed small.

(Embodiment 3)

Figure 13:
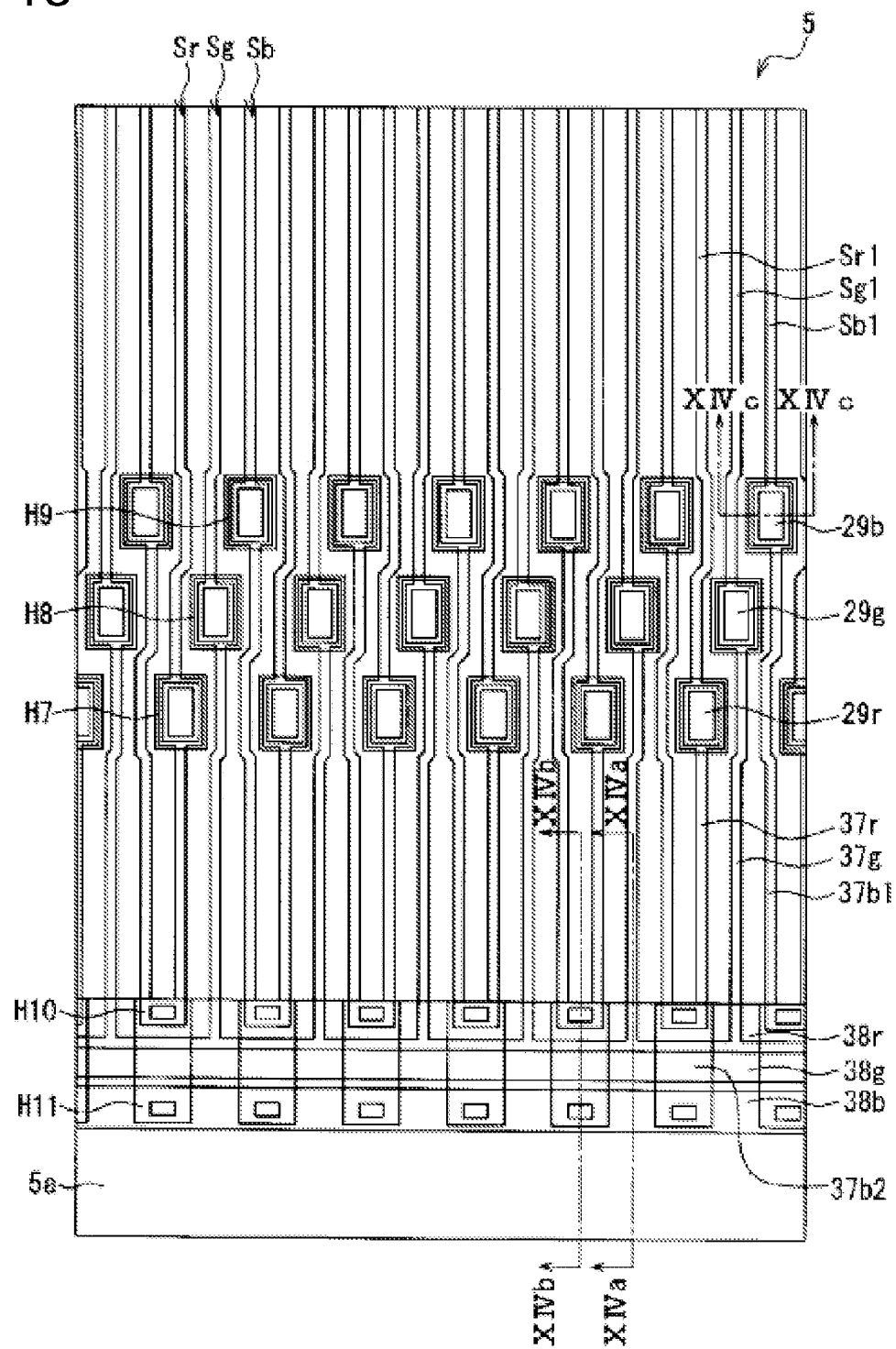
FIG. 13 is a view showing a configuration of main components of an active matrix substrate according to Embodiment 3 of the present invention before laser-cutting is performed thereon.
Figure 14:
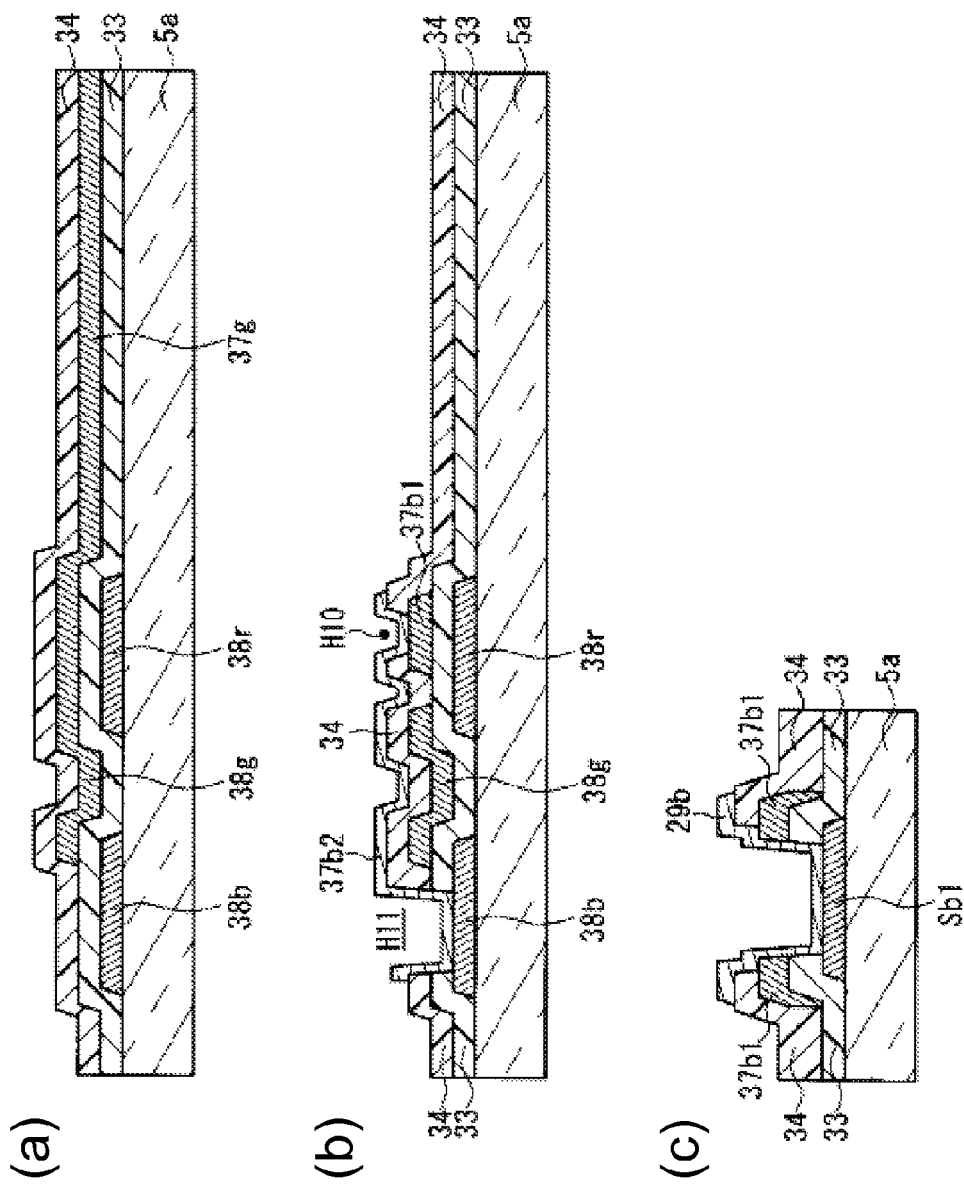
FIG. 14(a) is a cross-sectional view of FIG. 13 along the line XIVa-XIVa.
FIG. 14(b) is a cross-sectional view of FIG. 13 along the line XIVb-XIVb.
FIG. 14(c) is a cross-sectional view of FIG. 13 along the line XIVc-XIVc.
Figure 15:
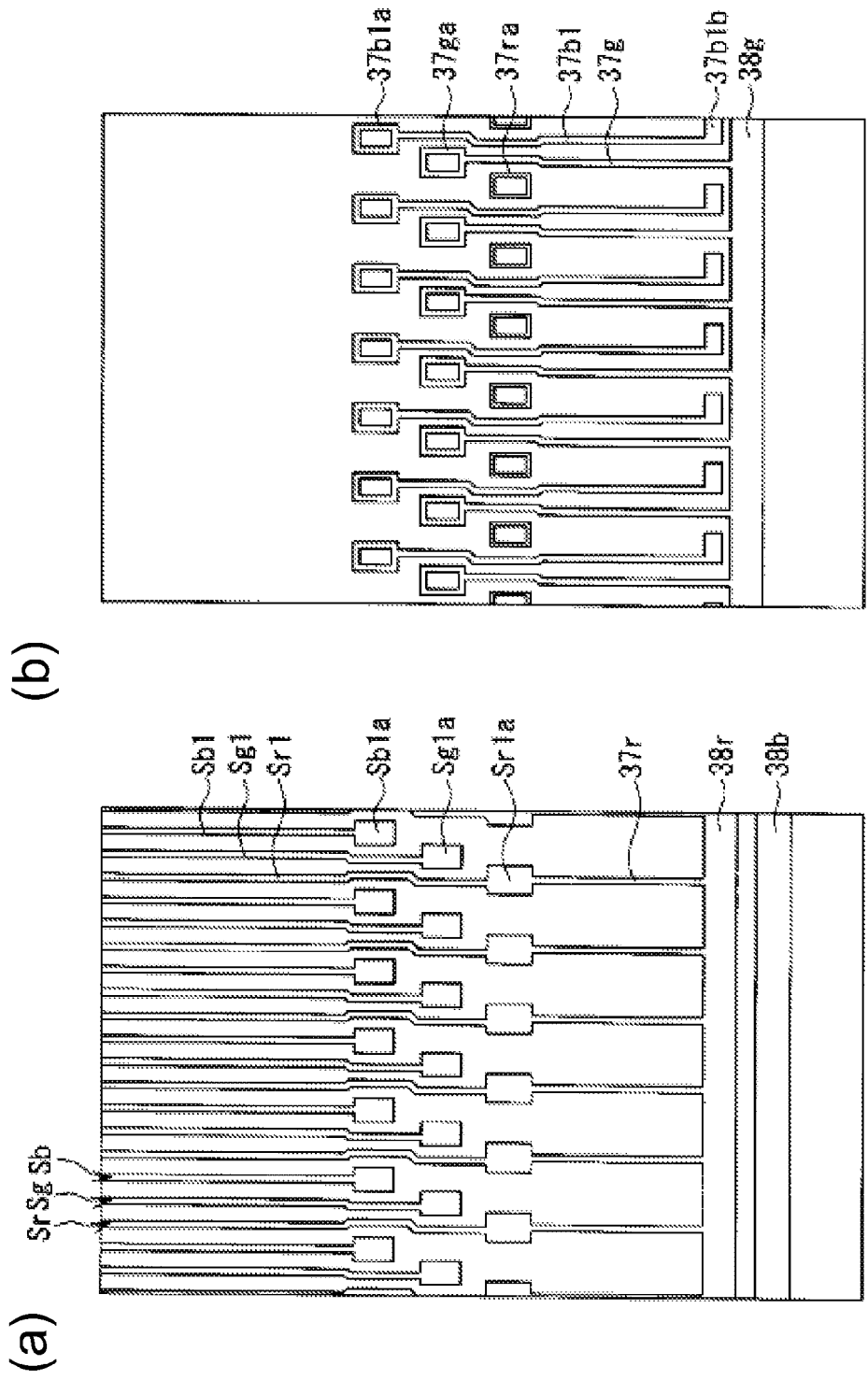
FIGS. 15(a) and 15(b) are views respectively showing a configuration of a gate layer and a configuration of a source layer among a configuration of main components of the active matrix substrate shown in FIG. 13.
Figure 16:
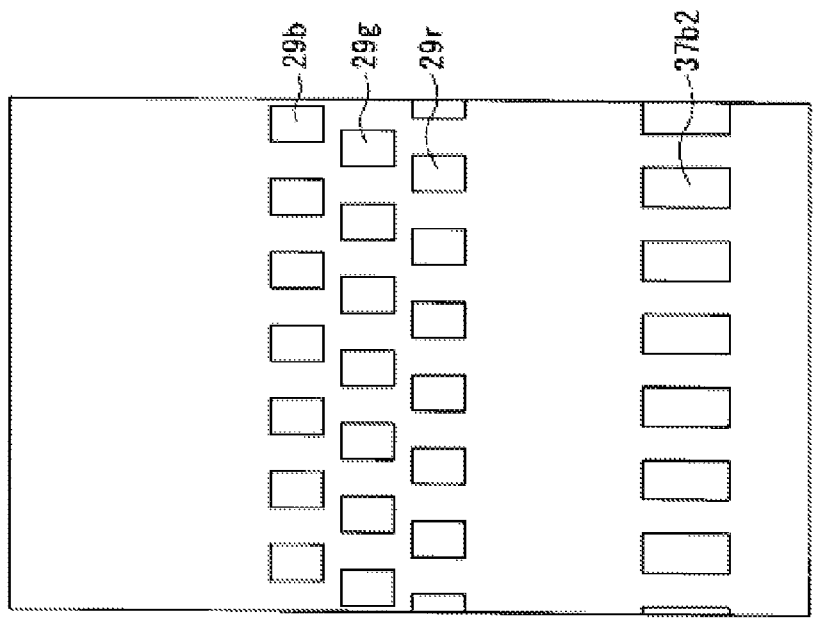
FIGS. 16(a) and 16(b) are views respectively showing a configuration of a protective insulating film and a configuration of a pixel electrode layer among a configuration of main components of the active matrix substrate shown in FIG. 13.
Figure 16:
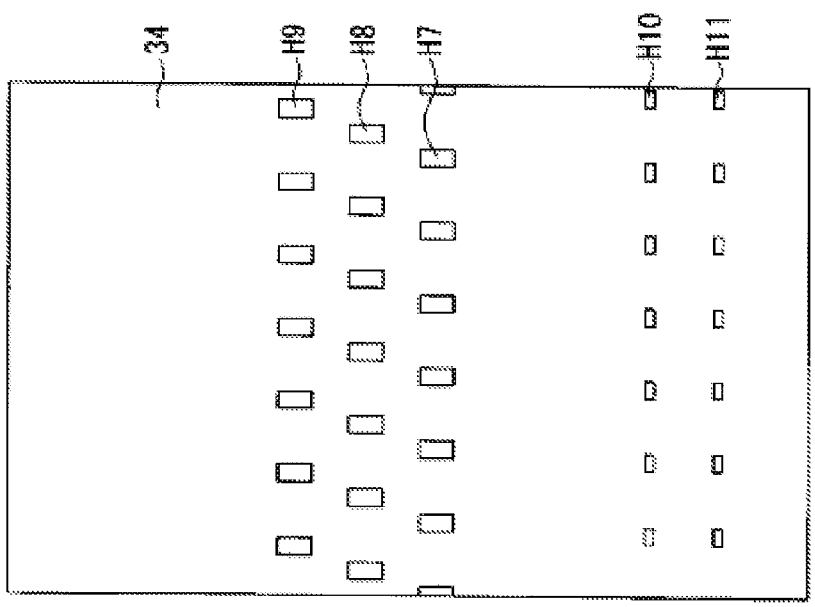

FIG. 13 is a view that describes the configuration of main components of an active matrix substrate according to Embodiment 3 of the present invention before laser-cutting is performed. FIG. 14(a) is a cross-sectional view of FIG. 13 along the line XIVa-XIVa, FIG. 14(b) is a cross-sectional view of FIG. 13 along the line XIVb-XIVb, and FIG. 14(c) is a cross-sectional view of FIG. 13 along the line XIVc-XIVc. FIGS. 15(a) and 15(b) are views that describe a configuration of the gate layer and the source layer, respectively, among the configuration of the main components of the active matrix substrate shown in FIG. 13. FIGS. 16(a) and 16(b) are views that describe a configuration of the protective insulating film and a configuration of the pixel electrode layer, among the configuration of main components of the active matrix substrate shown in FIG. 13.

In the drawings, the main difference between the present embodiment and Embodiment 1 is that a second connecting line made of the source layer (second conductive layer) is connected to the electrode terminal, and in that a first connecting portion of a third connecting line made of the source layer and a second connecting portion of the third connecting line made of the pixel electrode layer (third conductive layer) are used. The same reference characters are given to elements that are common with Embodiment 1 above, and duplicative descriptions are omitted.

In other words, in FIGS. 13 to 16(b), in the active matrix substrate 5 of the present embodiment, of the adjacent three source lines Sr, Sb, and Sg, an end portion Sr1 on one end (left side of FIG. 13) of the source line Sr is connected to the first short bar 38r made of the first conductive layer through the first connecting line 37r made of the first conductive layer. Also, the end portion Sr1, the first connecting line 37r, and the first short bar 38r, as shown in FIG. 15(a), are made of the first conductive layer (gate layer), and thus, are formed integrally with each other. In FIG. 15(a), the end portion Sr1 is provided with a lower electrode Sr1a. Also, as shown in FIG. 15(b), in the first connecting line 37r, a frame shaped electrode 37ra is made of the second conductive layer (source layer), and the lower electrode Sr1a is connected to the electrode 37ra through an electrode terminal 29r in a contact hole H7.

In the active matrix substrate 5 of the present embodiment, among the adjacent three source lines Sr, Sb, and Sg, the end portion Sg1 of the middle source line Sg is connected to the second short bar 38g made of the second conductive layer through the second connecting line 37g made of the second conductive layer. In FIG. 15(a), the end portion Sg1 is provided with a lower electrode Sg1a. As shown in FIG. 15(b), in the second connecting line 37g, a frame shaped electrode 37ga is made of the second conductive layer (source layer), and the lower electrode Sg1a is connected to the electrode 37ga through an electrode terminal 29g in a contact hole H8.

In other words, the source line Sg is connected to the second connecting line 37g at the electrode terminal 29g provided on the tip of the end portion Sg1 and to which an electrode of the source driver 16, which drives the corresponding source line Sg, is connected. Also, the second connecting line 37g and the second short bar 38g are, as shown in FIG. 15(b), made of the second conductive layer, and thus, are formed integrally with each other.

Also, in the active matrix substrate 5 of the present embodiment, of the adjacent three source lines Sr, Sb, and Sg, the end portion Sb1 of the source line Sb on the other end (right side of FIG. 13) is connected to the third short bar 38b made of the first conductive layer, through the first connecting portion 37b1 of the third connecting line made of the second conductive layer and the second connecting portion 37b2 of the third connecting line made of the third conductive layer (pixel electrode layer). In FIG. 15(a), the end portion Sb1 is provided with a lower electrode Sb1a. As shown in FIG. 15(b), in the first connecting portion 37b1 of the third connecting line, the frame-shaped electrode 37b1a is made of the second conductive layer, and in the contact hole H9, the lower electrode Sb1a is connected to the electrode 37b1a through the electrode terminal 29b.

In other words, the source line Sb is connected to the first connecting portion 37b1 of the third connecting line at the electrode terminal 29b provided on the tip of the end portion Sb1 and to which an electrode of the source driver 16, which drives the corresponding source line Sb, is connected.

Also, as shown in FIG. 15(b), in the first connecting portion 37b1 of the third connecting line, the electrode 37b1b is made of the second conductive layer and is connected to one end of the second connecting portion 37b2 of the third connecting line in the contact hole H10. The contact hole H10 is provided over the first short bar 38r. In other words, in the third connecting line, the first connecting portion 37b1 and the second connecting portion 37b2 are connected to each other over the first short bar 38r. The other end of the second connecting portion 37b2 of the third connecting line is connected to the third short bar 38b in the contact hole H11.

Also, in the active matrix substrate 5 of the present embodiment, only the protective insulating film 34 is provided as the second insulating layer.

With the above-mentioned configuration, in the present embodiment, functions and effects similar to those in Embodiment 1 above can be achieved. Also, in the present embodiment, similar to Embodiment 1, it is possible to appropriately connect the corresponding source lines Sr, Sg, and Sb to the first, second, and third short bars 38r, 38g, and 38b while reducing the size of the area where the first, second, and third short bars 38r, 38g, and 38b are disposed.

Also, in the present embodiment, in the electrode terminal 29g, the terminal Sg1 of the source line Sg is connected to the second connecting line 37g, and in the electrode terminal 29b, the terminal Sb1 of the source line Sb is connected to the first connecting portion 37b1 of the third connecting line. As a result, in the present embodiment, it is possible to make the respective wiring line regions of the second connecting line 37g and third connecting line small, while easily connecting the corresponding source lines Sg and Sb to the source driver 16.

Also, in the present embodiment, in the third connecting line, the first connecting portion 37b1 and second connecting portion 37b2 are connected to each other over the first short bar 38r, and thus, it is possible to make the wiring region of the third connecting line smaller.

(Embodiment 4)

Figure 17:
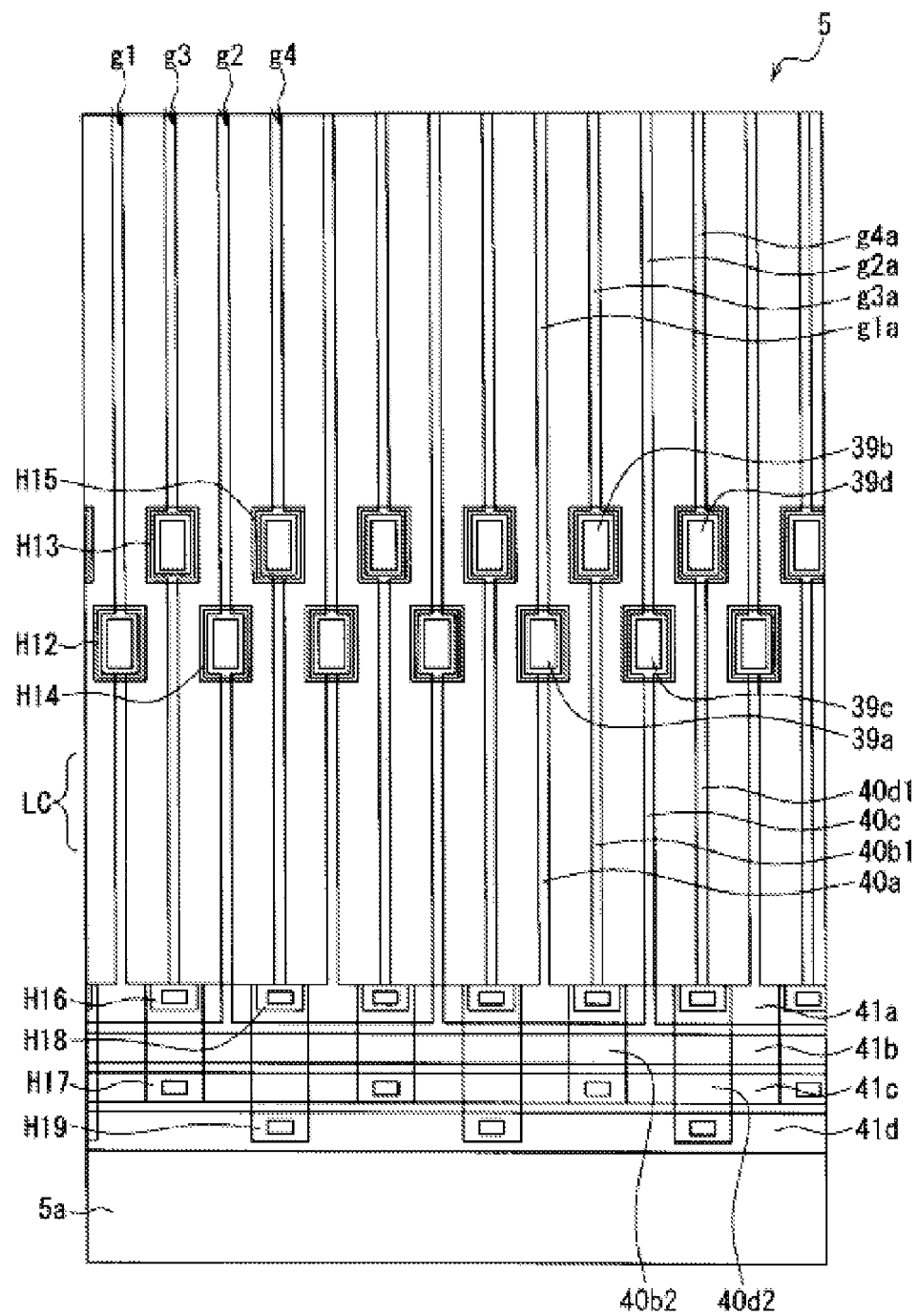
FIG. 17 is a view showing main components of an active matrix substrate according to Embodiment 4 of the present invention before laser-cutting is performed thereon.
Figure 18:
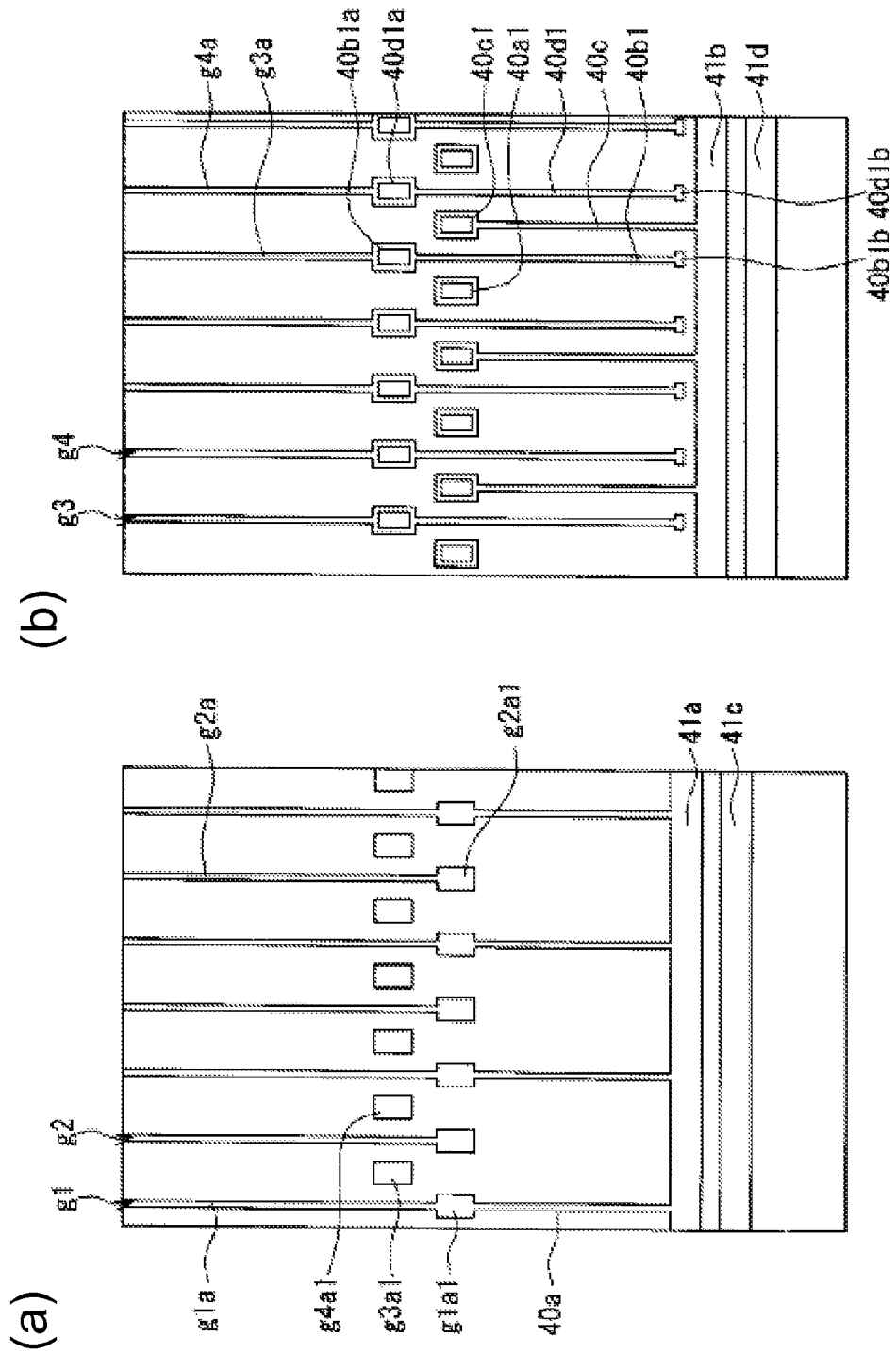
FIGS. 18(a) and 18(b) are views respectively showing a configuration of a gate layer and a configuration of a source layer among main components of the active matrix substrate shown in FIG. 17.
Figure 19:
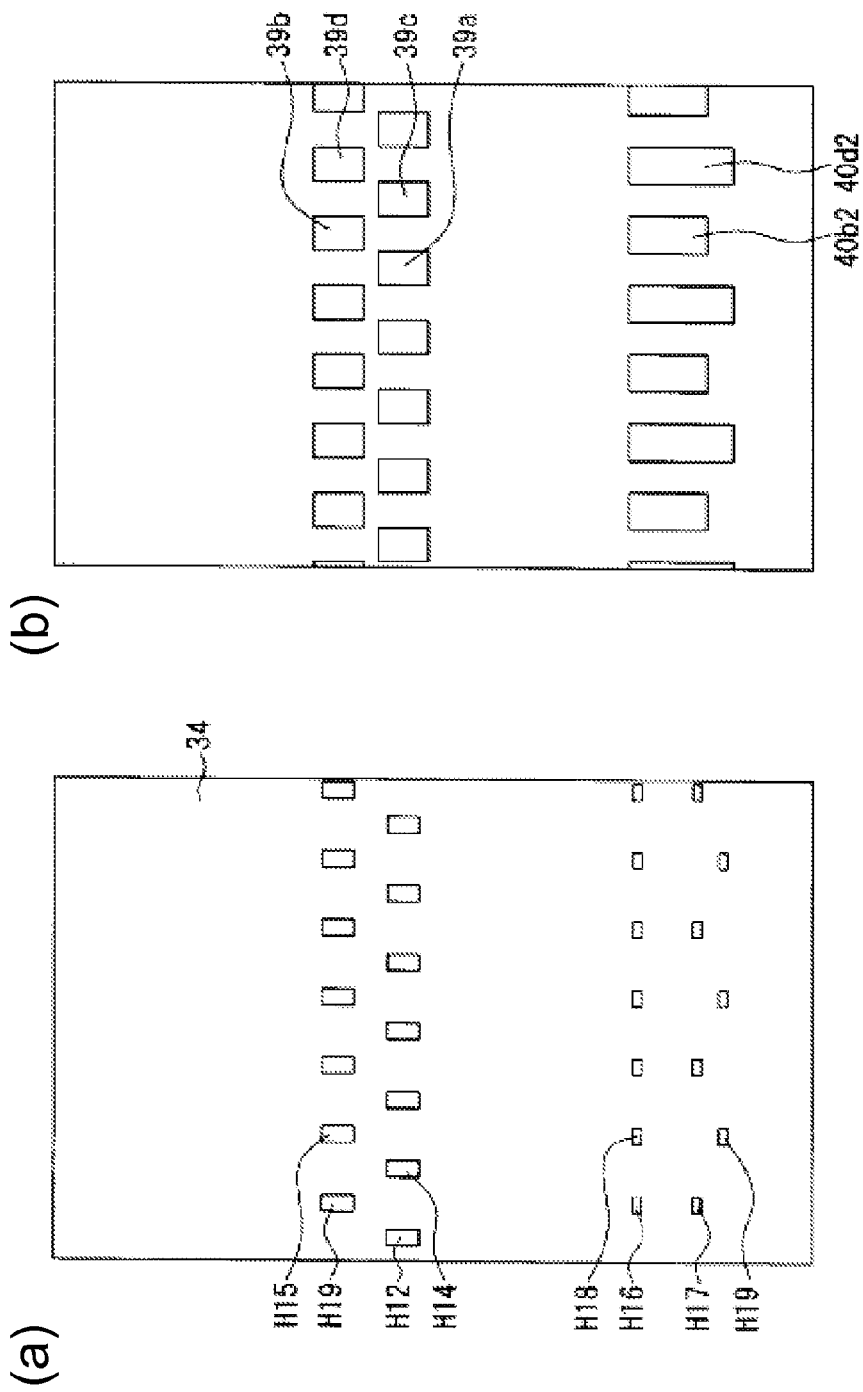
FIGS. 19(a) and 19(b) are views respectively showing a configuration of a protective insulating film and a configuration of a pixel electrode layer among a configuration of main components of the active matrix substrate shown in FIG. 17.

FIG. 17 is a view that describes the configuration of main components of an active matrix substrate according to Embodiment 4 of the present invention before laser-cutting is performed. FIGS. 18(a) and 18(b) are views that describe a configuration of the gate layer and the source layer, respectively, of the configuration of main components of the active matrix substrate shown in FIG. 17. FIGS. 19(a) and 19(b) are views that describe a configuration of the protective insulating film and a configuration of the pixel electrode layer, among the configuration of the main components of the active matrix substrate shown in FIG. 17. In the drawings, the main difference between the present embodiment and Embodiment 1 is that four short bars are provided, and that adjacent four gate lines (scan lines) are respectively connected to the four short bars. The same reference characters are given to elements that are common with Embodiment 1 above, and duplicative descriptions are omitted.

In other words, in FIGS. 17 to 19(b), in the active matrix substrate 5 of the present embodiment, among adjacent four gate lines g1, g3, g2, and g4, ends g1a and g3a of the adjacent two gate lines g1 and g3 are respectively made of the first conductive layer (gate layer) and the second conductive layer (source layer). Also, ends g2a and g4a of the adjacent two gate lines g2 and g4 are respectively made of the first conductive layer and the second conductive layer.

In the active matrix substrate 5 of the present embodiment, electrode terminals 39a, 39b, 39c, and 39d are provided so as to be connected to the electrode of the gate driver.

In the active matrix substrate 5 of the present embodiment, the end portion g1a of the first gate line g1 made of the first conductive layer is connected to a first short bar 41a made of the first conductive layer through a first connecting line 40a made of the first conductive layer. Also, the end portion g1a, the first connecting line 40a, and the first short bar 41a, as shown in FIG. 18(a), are made of the first conductive layer, and thus, are formed integrally with each other. In FIG. 18(a), the end portion g1a is provided with a lower electrode g1a1. Also, as shown in FIG. 18(b), in the first connecting line 40a, a frame-shaped electrode 40a1 is made of the second conductive layer, and the lower electrode g1a1 is connected to the electrode 40a1 through the electrode terminal 39a, in the contact hole H12.

Also, in the active matrix substrate 5 of the present embodiment, the terminal g3a of the third gate line g3 made of the second conductive layer is connected to the third short bar 41c made of the first conductive layer through the first connecting portion 40b1 of the third connecting line made of the second conductive layer and the second connecting portion 40b2 of the third connecting line made of the third conductive layer (pixel electrode layer). In FIG. 18(a), the end portion g3a is provided with a lower electrode g3a1. Also, as shown in FIG. 18(b), in the first connecting portion 40b1 of the third connecting line, the frame shaped electrode 40b1a is made of the second conductive layer, and the lower electrode g3a1 is connected to the electrode 40b1a through the electrode terminal 39b in the contact hole H13.

Also, as shown in FIG. 18(b), in the first connecting portion 40b1 of the third connecting line, the electrode 40b1b is made of the second conductive layer and is connected to one end of the second connecting portion 40b2 of the third connecting line in the contact hole H16. The contact hole H16 is provided over the first short bar 41a. In other words, in the third connecting line, the first connecting portion 40b1 and the second connecting portion 40b2 are connected to each other over the first short bar 41a. The other end of the second connecting portion 40b2 of the third connecting line is connected to the third short bar 41c in the contact hole H17.

In the active matrix substrate 5 of the present embodiment, the end portion g2a of the second gate line g2 made of the first conductive layer is connected to a second short bar 41b made of the second conductive layer through a second connecting line 40c made of the second conductive layer. In FIG. 18(a), the end portion g2a is provided with a lower electrode g2a1. Also, as shown in FIG. 18(b), in the second connecting line 40c, a frame-shaped electrode 40c1 is made of the second conductive layer, and the lower electrode g2a1 is connected to the electrode 40c1 through the electrode terminal 39c, in the contact hole H14.

In other words, the second gate line g2 is connected to the second connecting line 40c at the electrode terminal 39c provided on the tip of the end portion g2a and to which an electrode of the gate driver 17, which drives the corresponding gate line g2, is connected. Also, the second connecting line 40c and the second short bar 41b are, as shown in FIG. 18(b), made of the second conductive layer, and thus, are formed integrally with each other.

Also, in the active matrix substrate 5 of the present embodiment, the terminal g4a of the fourth gate line g4 made of the second conductive layer is connected to the fourth short bar 41d made of the second conductive layer through the first connecting portion 40d1 of the fourth connecting line made of the second conductive layer and the second connecting portion 40d2 of the fourth connecting line made of the third conductive layer. In FIG. 18(a), the end portion g4a is provided with a lower electrode g4a1. As shown in FIG. 18(b), in the first connecting portion 40d1 of the third connecting line, a frame-shaped electrode 40d1a is made of the second conductive layer, and a lower electrode g4a1 is connected to the electrode 40d1a through the electrode terminal 39d, in the contact hole H15.

Also, as shown in FIG. 18(b), in the first connecting portion 40d1 of the third connecting line, the electrode 40d1b is made of the second conductive layer and is connected to one end of the second connecting portion 40d2 of the third connecting line in the contact hole H18. The contact hole H18 is provided over the first short bar 41a. In other words, in the third connecting line, the first connecting portion 40d1 and the second connecting portion 40d2 are connected to each other over the first short bar 41a. The other end of the second connecting portion 40d2 of the third connecting line is connected to the fourth short bar 41d in the contact hole H19.

With the above-mentioned configuration, in the present embodiment, functions and effects similar to those in Embodiment 1 above can be achieved. Also, in the present embodiment, similar to Embodiment 1, it is possible to appropriately connect the corresponding gate lines g1, g2, g3, and g4 to the first, second, third, and fourth short bars 41a, 41b, 41c, and 41d while reducing the area in which the first, second, third, and fourth short bars 41a, 41b, 41c, and 41d are disposed.

Also, in the present embodiment, the end portion g2a of the second gate line g2 is connected to the second connecting line 40c in the electrode terminal 39c. As a result, in the present embodiment, it is possible to make the wiring area of the second connecting line 40c small, and to easily connect the corresponding gate line g2 to the gate driver 17.

Also, in the present embodiment, in the third connecting line, the first connecting portion 40b1 and the second connecting portion 40b2 are connected to each other over the first short bar 41a, and in the fourth connecting line, the first connecting portion 40d1 and the second connecting portion 40d2 are connected to each other over the first short bar 41a. As a result, in the present embodiment, the respective wiring regions of the third connecting line and the fourth connecting line can be made smaller.

(Embodiment 5)

Figure 20:
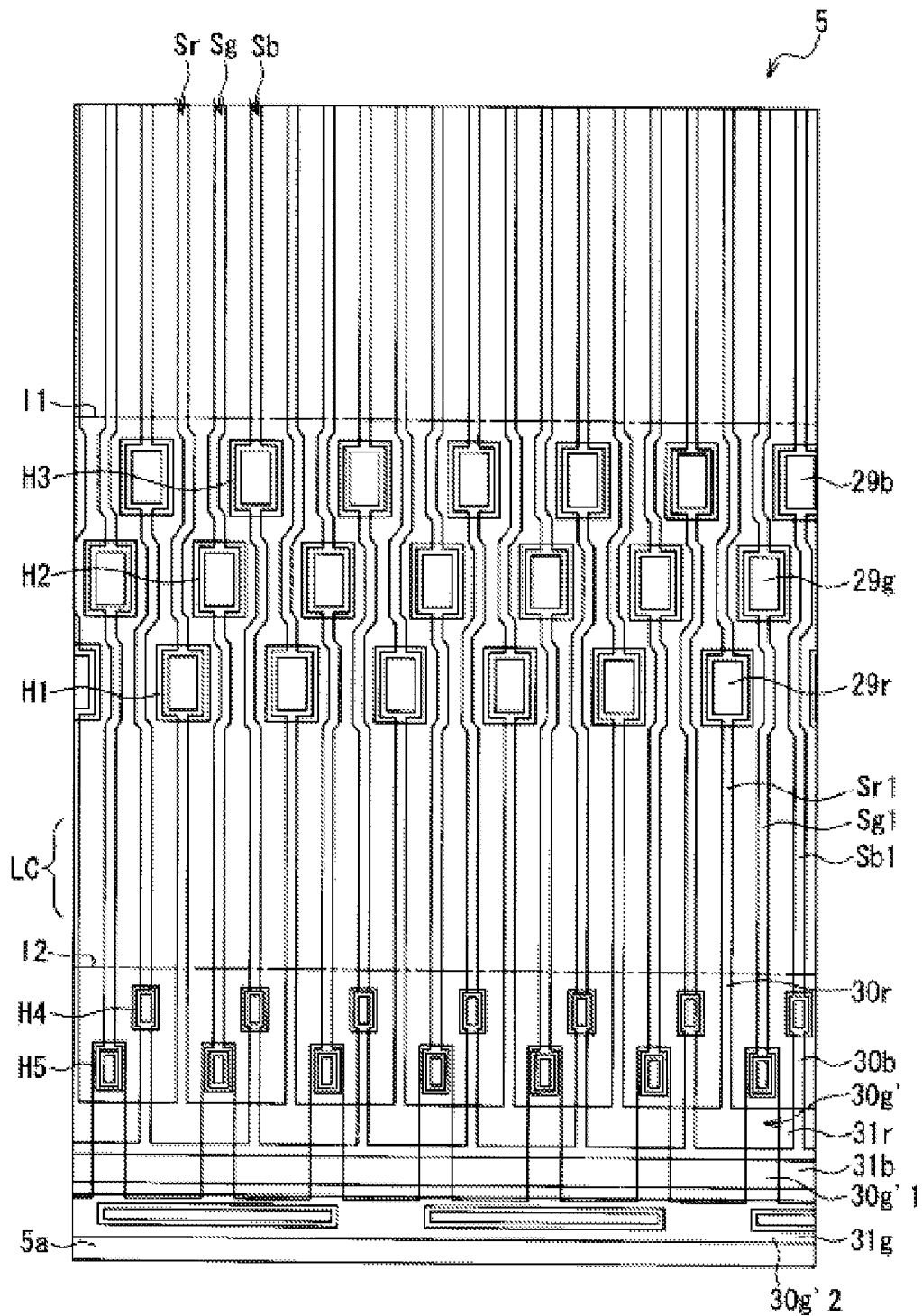
FIG. 20 is a view showing a configuration of main components of an active matrix substrate according to Embodiment 5 of the present invention before laser-cutting is performed thereon.
Figure 21:
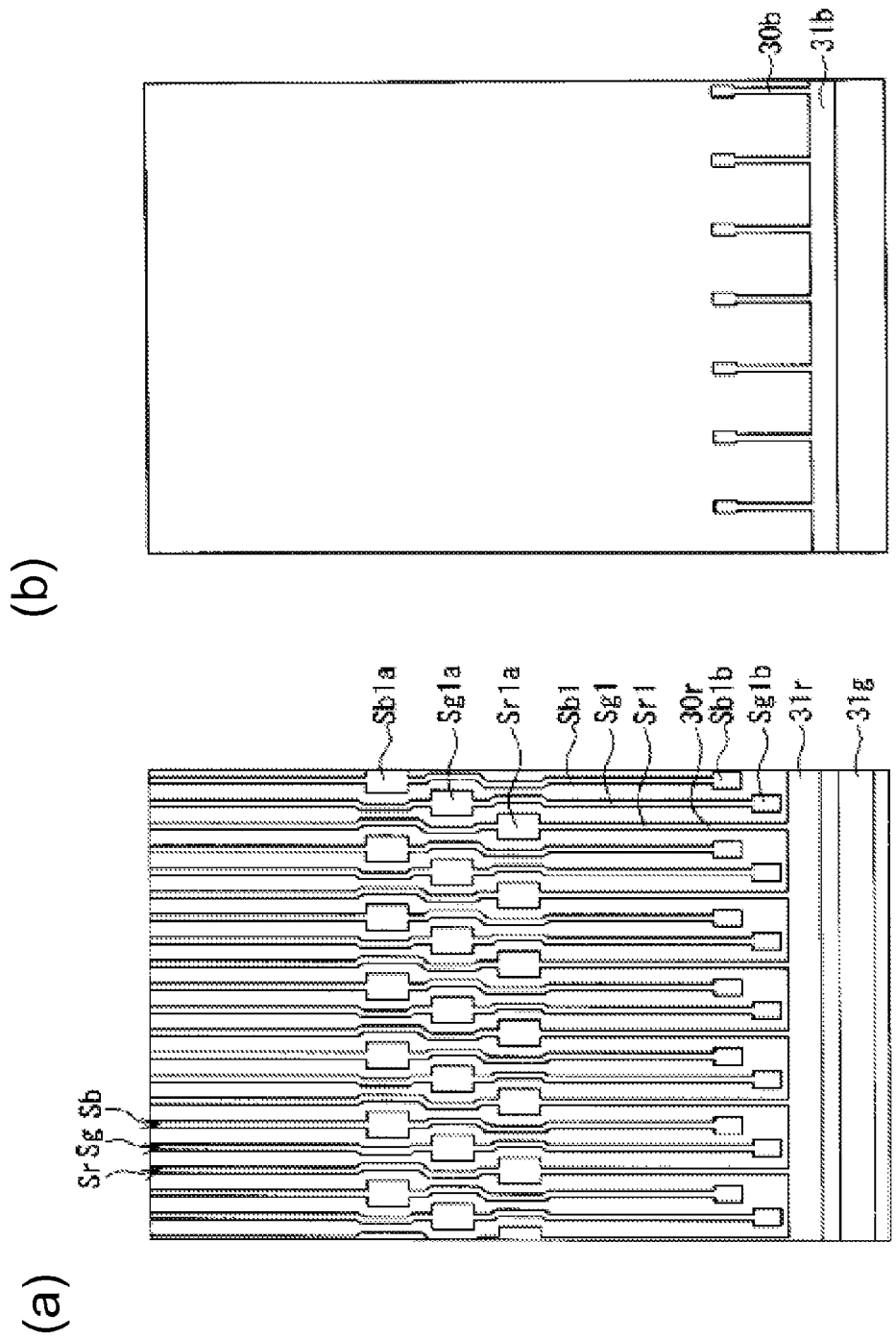
FIGS. 21(a) and 21(b) are views respectively showing a configuration of a gate layer and a configuration of a source layer among a configuration of main components of the active matrix substrate shown in FIG. 20.

FIG. 20 is a view that describes the configuration of main components of an active matrix substrate according to Embodiment 5 of the present invention before laser-cutting is performed. FIGS. 21(a) and 21(b) are views that describe a configuration of the gate layer and the source layer, respectively, of the configuration of main components of the active matrix substrate shown in FIG. 20. FIGS. 22(a) and 22(b) are views that describe a configuration of the interlayer insulating film and the protective insulating film and a configuration of the pixel electrode layer, among the configuration of main components of the active matrix substrate shown in FIG. 20. In the drawings, the main difference between the present embodiment and Embodiment 1 is that a plurality of third connecting lines are provided so as to be connected to each other over a third short bar. The same reference characters are given to elements that are common with Embodiment 1 above, and duplicative descriptions are omitted.

Figure 22:
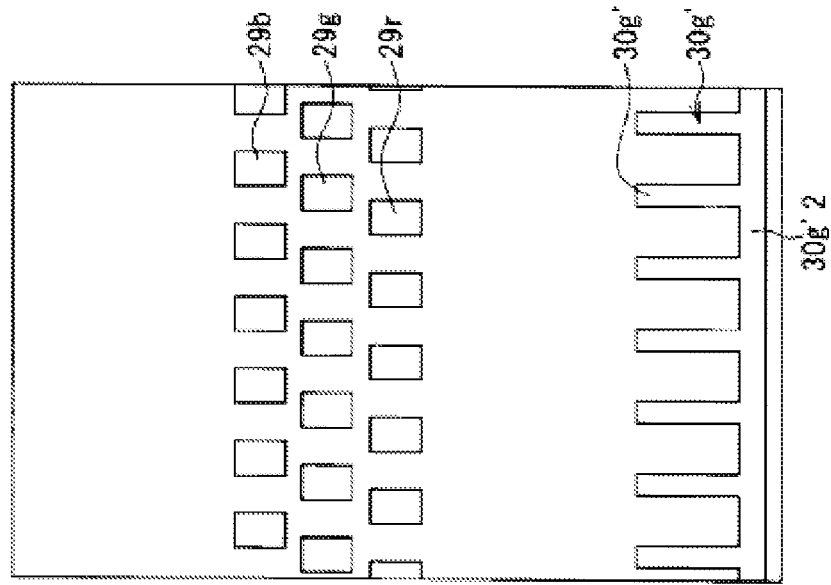
FIGS. 22(a) and 22(b) are views respectively showing a configuration of an interlayer insulating film and a protective insulating film and a configuration of a pixel electrode layer among a configuration of main components of the active matrix substrate shown in FIG. 20.
Figure 22:
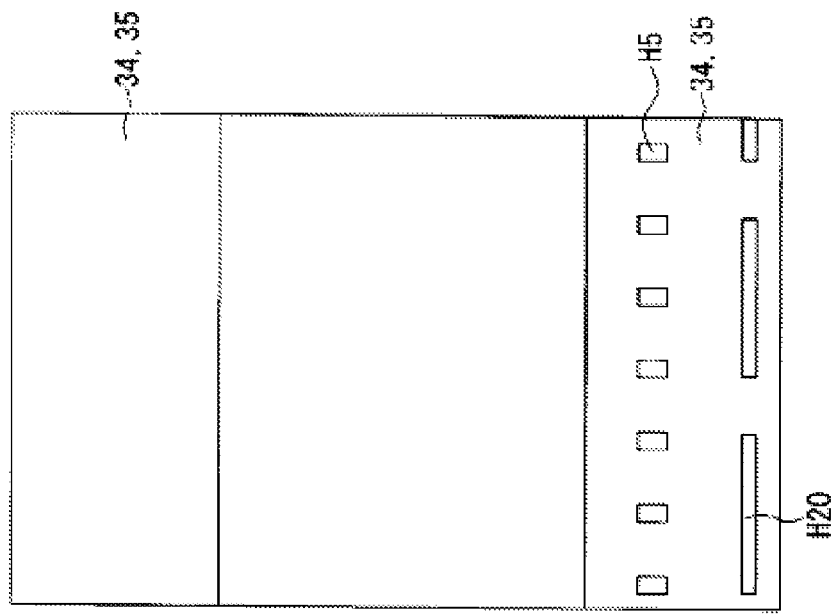

In other words, in FIGS. 20 to 22(b), in the active matrix substrate 5 of the present embodiment, the plurality of third connecting lines are provided so as to be connected to each other over a third short bar 31g. Specifically, a plurality of separate lines 30g'1 of a third connecting line 30g' are connected to each other by a common line 30g'2 over the third short bar 31g. These separate lines 30g'1 correspond to the third connecting line 30g shown in FIG. 10(b), and as shown in FIG. 22(b), the plurality of separate lines 30g'1 are integrally connected to each other by the common line 30g'2 provided in parallel with the third short bar 31g.

With the above-mentioned configuration, in the present embodiment, functions and effects similar to those in Embodiment 1 above can be achieved. In the present embodiment, the plurality of separate lines 30g'1 of the third connecting line 30g' are connected to each other by the common line 30g'2 over the third short bar 31g. As a result, in the present embodiment, the resistance of the third connecting line 30g' can be made small, and the resistance of the third short bar 31g can also be made small, and thus, the width of the third short bar 31g can be reduced.

(Embodiment 6)

Figure 23:
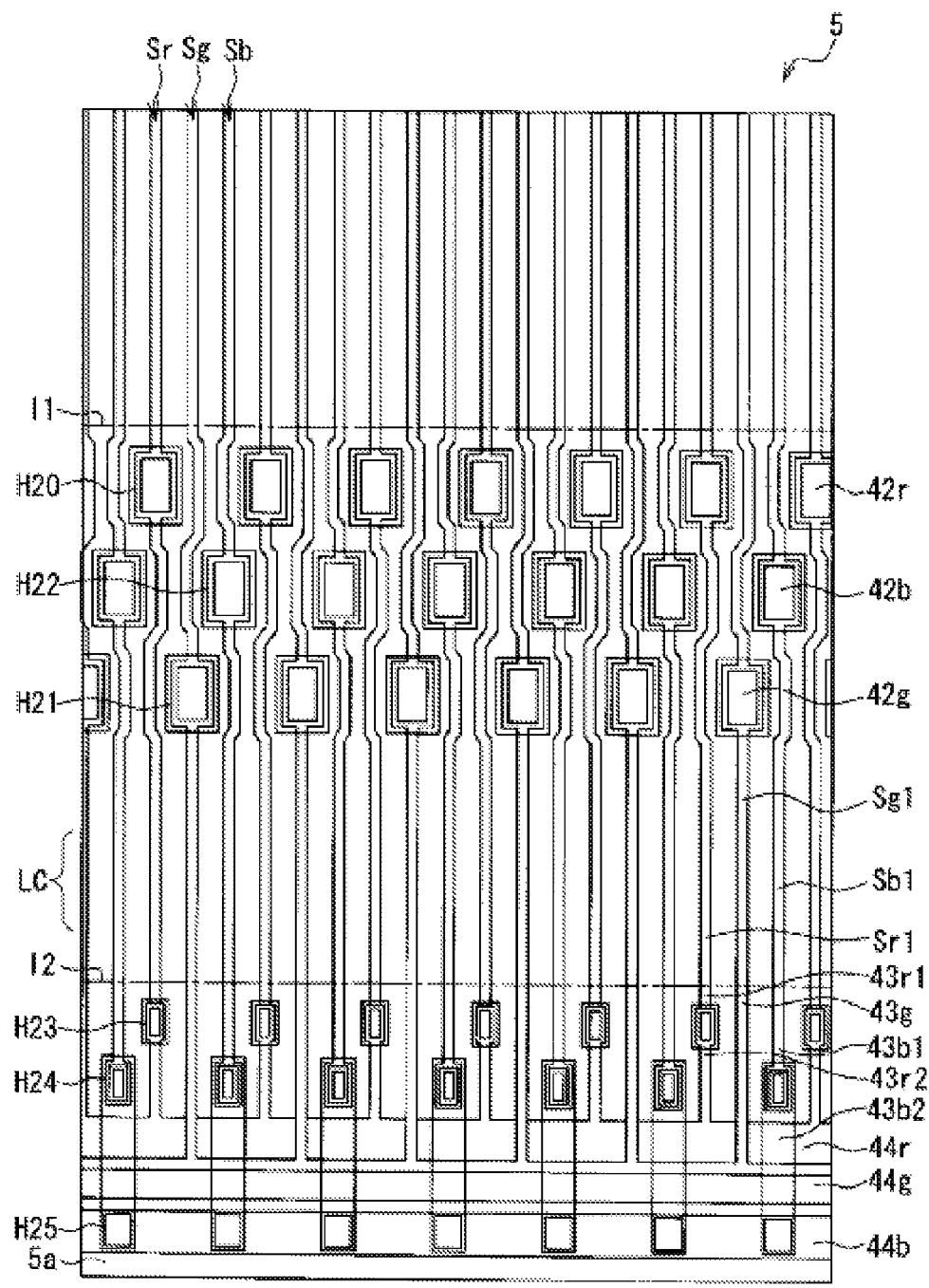
FIG. 23 is a view showing a configuration of main components of an active matrix substrate according to Embodiment 6 of the present invention before laser-cutting is performed thereon.
Figure 24:
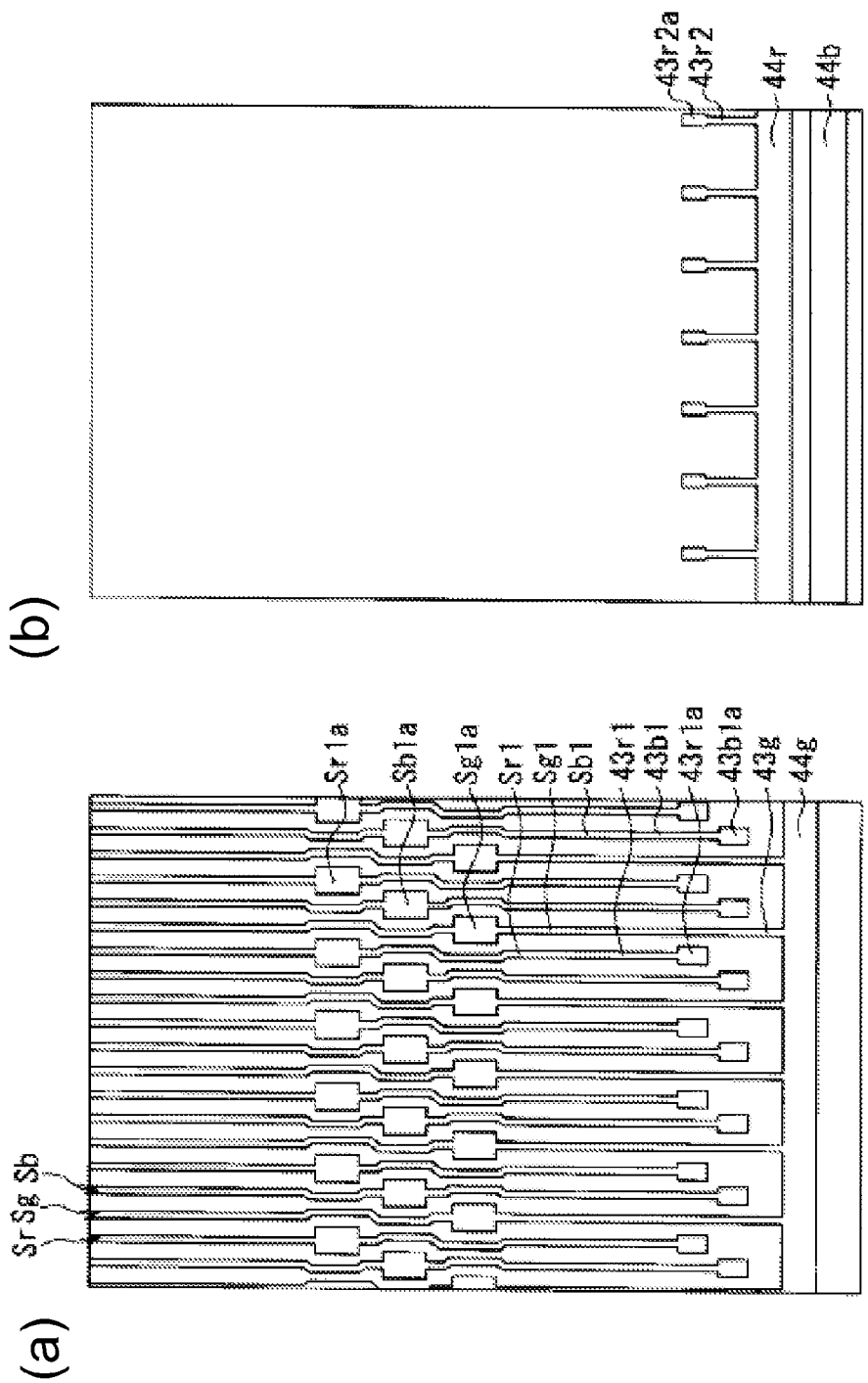
FIGS. 24(a) and 24(b) are views respectively showing a configuration of a gate layer and a configuration of a source layer among a configuration of main components of the active matrix substrate shown in FIG. 23.
Figure 25:
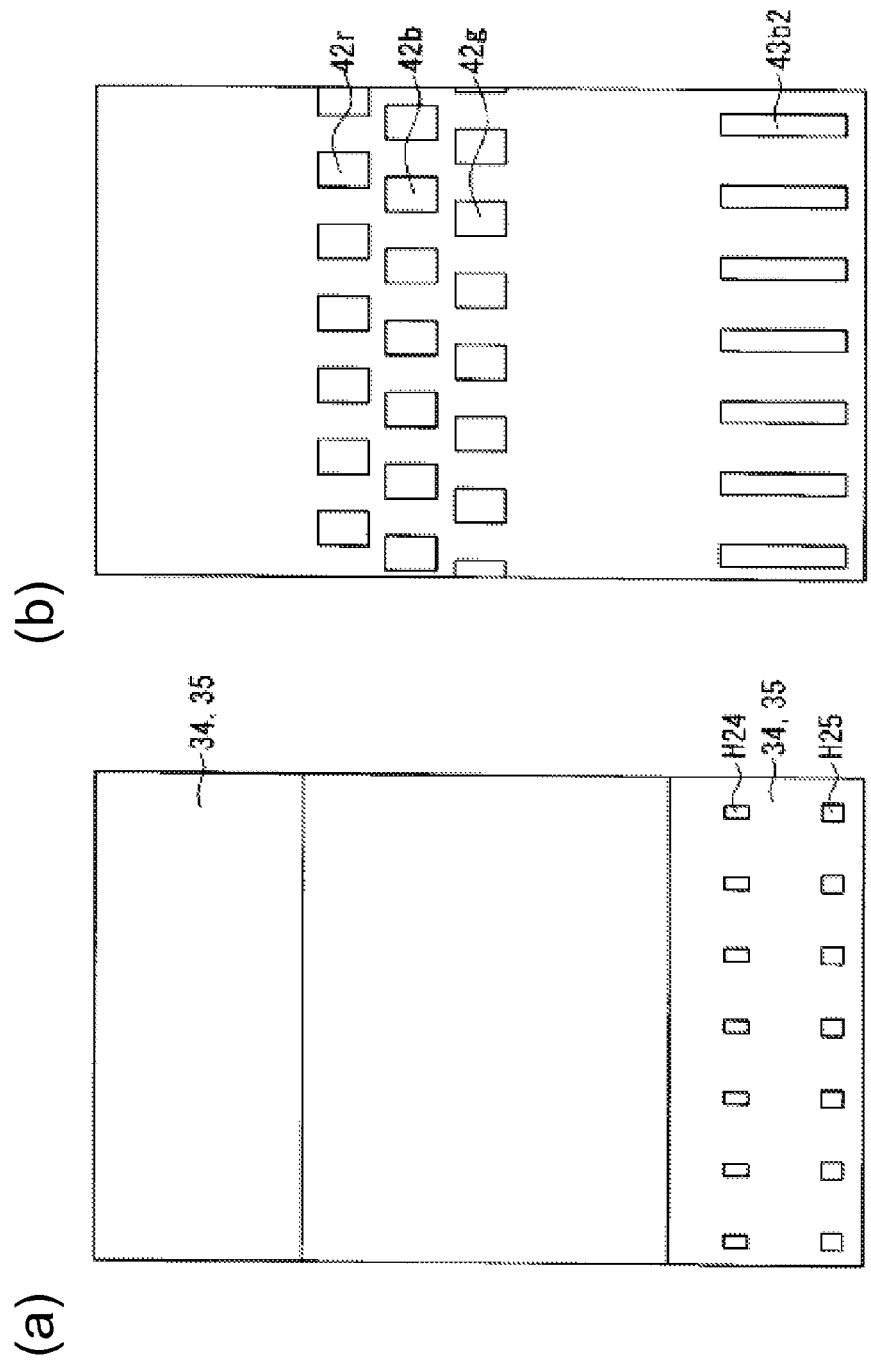
FIGS. 25(a) and 25(b) are views respectively showing a configuration of an interlayer insulating film and a protective insulating film and a configuration of a pixel electrode layer among a configuration of main components of the active matrix substrate shown in FIG. 23.

FIG. 23 is a view that describes the configuration of main components of an active matrix substrate according to Embodiment 6 of the present invention before laser-cutting is performed. FIGS. 24(a) and 24(b) are views that describe a configuration of the gate layer and the source layer, respectively, of the configuration of main components of the active matrix substrate shown in FIG. 23. FIGS. 25(a) and 25(b) are views that describe a configuration of the interlayer insulating film and the protective insulating film and a configuration of the pixel electrode layer, among the configuration of main components of the active matrix substrate shown in FIG. 23. In the drawings, the main difference between the present embodiment and Embodiment 1 is that first and third short bars are made of the source layer (second conductive layer), and that a second short bar is made of the gate layer (first conductive layer). The same reference characters are given to elements that are common with Embodiment 1 above, and duplicative descriptions are omitted.

In other words, in FIGS. 23 to 25(b), in the active matrix substrate 5 of the present embodiment, among adjacent three source lines Sr, Sb, and Sg, an end portion Sr1 on one end (left side of FIG. 23) of the source line Sr is connected to a first short bar 44r made of the second conductive layer through a first connecting portion 43r1 of the first connecting line made of the first conductive layer (gate layer) and a second connecting portion 43r2 of the first connecting line made of the second conductive layer (source layer). In FIG. 24(a), the end portion Sr1 is provided with a lower electrode Sr1a, which is connected to the electrode terminal 42r in the contact hole H20 formed in the gate insulating film 33.

Also, the end portion Sr1 and the first connecting portion 43r1 of the first connecting line, as shown in FIG. 24(a), are made of the first conductive layer, and thus, are formed integrally with each other. Also, the electrode 43r1a is provided in the first connecting portion 43r1 of the first connecting line, and the second connecting portion 43r2 of the first connecting line is connected to the electrode 43r2a in the contact hole H23. Also, the second connecting portion 43r2 of the first connecting line and the first short bar 44r, as shown in FIG. 24(b), are made of the second conductive layer, and thus, are formed integrally with each other.

Also, in the active matrix substrate 5 of the present embodiment, among the adjacent three source lines Sr, Sb, and Sg, the end portion Sg1 of the middle source line Sg is connected to the second short bar 44g made of the first conductive layer through the second connecting line 43g made of the first conductive layer. Also, the end portion Sg1, the second connecting line 43g, and the second short bar 44g, as shown in FIG. 24(a), are made of the first conductive layer, and thus, are formed integrally with each other.

Also, in FIG. 24(a), the end portion Sg1 is provided with a lower electrode Sg1a, which is configured to be connected to the electrode terminal 42g in the contact hole H21 formed in the gate insulating film 33.

In the active matrix substrate 5 of the present embodiment, among the adjacent three source lines Sr, Sb, and Sg, an end portion Sb1 on the other end (right side of FIG. 23) of the source line Sb is connected to the third short bar 44b made of the second conductive layer through the first connecting portion 43b1 of the third connecting line made of the first conductive layer and the second connecting portion 43b2 of the third connecting line made of the third conductive layer (pixel electrode layer). Also, in FIG. 24(a), the end portion Sb1 is provided with a lower electrode Sb1a, which is configured to be connected to the electrode terminal 42b in the contact hole H22 formed in the gate insulating film 33.

Also, as shown in FIG. 24(a), in the first connecting portion 43b1 of the third connecting line, the electrode 43b1a is made of the first conductive layer and is connected to one end of the second connecting portion 43b2 of the third connecting line in the contact hole H24. The other end of the second connecting portion 43b2 of the third connecting line is connected to the third short bar 44b in the contact hole H25.

With the above-mentioned configuration, in the present embodiment, functions and effects similar to those in Embodiment 1 above can be achieved. In other words, in the present embodiment, similar to Embodiment 1, the corresponding source lines Sr, Sg, and Sb can be appropriately connected to the first, second, and third short bars 44r, 44g, and 44b while making the area where the first, second, and third short bars 44r, 44g, and 44b are disposed small.

All of the above-mentioned embodiments are illustrative and not limiting. The technical scope of the present invention is defined by the claims, and any modifications within a scope that corresponds to the configuration stated in the claims and their equivalents are also encompassed by the present invention.

For example, in the description above, a case was described in which the present invention is applied to a transmissive liquid crystal display device, but the active matrix substrate of the present invention is not limited thereto, and can be applied to a display device having an in-plane switching-type liquid crystal panel in which the common electrode is formed not on the opposite substrate but on the active matrix substrate, or various display panels such as a transflective or reflective liquid crystal panel, an organic EL (electroluminescent) element, an inorganic EL element, a field emission display, or a microcapsule type electrophoretic electronic paper. Also, besides such display devices, the active matrix substrate of the present invention can be applied to various sensor substrates such as a sensor substrate for an X-ray detection device, for example.

Also, in the description above, a configuration in which three or four short bars are provided were described, but the active matrix substrate of the present invention is not limited as long as at least three short bars are provided so as to be connected individually to at least one side of a plurality of data lines (source lines) and a plurality of scan lines (gate lines), as long as a prescribed number of corresponding data lines or scan lines are connected to the at least three short bars, and as long as among the three short bars, the middle short bar of the three adjacent short bars is provided in a layer different from the short bars on both sides thereof. For example, a configuration in which, among the three short bars, the middle short bar and a short bar on one side thereof overlap as in Embodiment 1, and in which the middle short bar and a short bar on the other side does not overlap as in Embodiment 2 may be used.

Also, in the description above, a configuration in which the source driver and the gate driver are disposed on the active matrix substrate was described, but the active matrix substrate of the present invention is not limited thereto, and a configuration in which the source driver and the gate driver are not disposed on the active matrix substrate may be used. In other words, a configuration in which electrode terminals and driver signal input terminals are not provided on the active matrix substrate, and drivers are provided on the FPC, for example, may be used. Even if the source driver and the gate driver are not disposed on the active matrix substrate in this manner, it is possible to make the area where the short bars are disposed small, and thus, it is possible to form a large number of active matrix substrates from one motherboard.

Also, in the description above, a configuration in which laser-cutting is performed on end portions of the data lines or end portions of the scan lines was described, but the active matrix substrate of the present invention is not limited thereto, and beveling, for example, can be performed on the short bar so as to physically remove the short bar, in order to independently control the plurality of data lines and/or the plurality of scan lines.

Also, in the description above, a configuration was described in which data lines are provided for pixels of each color of red (R), green (G), and blue (B), but the active matrix substrate of the present invention is not limited thereto, and a configuration in which RGB pixels are sequentially provided for one data line, for example, may be used.

Also, in the description above, a case was described in which the plurality of short bars are provided in a direction perpendicular to and a direction parallel to the corresponding data lines or scan lines, but the active matrix substrate of the present invention is not limited thereto, and a configuration may be used in which a plurality of short bars are provided diagonally in relation to the corresponding data lines or scan lines, for example. However, a case in which the plurality of short bars and the data lines or scan lines corresponding thereto are provided perpendicular to each other as in the respective embodiments above is preferable in that the area where the plurality of short bars are disposed and the wiring region connected to the short bars can be made small, thus allowing the active matrix substrate to be made more compact with ease.

Also, in the respective Embodiments 1 to 3, 5, and 6, a configuration of the data lines (source lines) was described, and in Embodiment 4, a configuration of the scan lines (gate lines) was described. However, the active matrix substrate of the present invention is not limited thereto, and the configuration of Embodiment 1, for example, may be applied to the scan lines, or the configuration of Embodiment 4 may be applied to the data lines. Also, the configurations of the respective embodiments may be combined when configuring the data lines and scan lines.

INDUSTRIAL APPLICABILITY

The present invention is useful in a compact active matrix substrate in which the area where the short bars are disposed can be made small, and in a display device using this.

DESCRIPTION OF REFERENCE CHARACTERS 1 liquid crystal display device (display device)
5 active matrix substrate
5a base member
16 source driver
17, 17a, 17b gate driver
18 thin film transistor
19 pixel electrode (third conductive layer)
29r, 29g, 29b, 39a, 39b, 39c, 39d electrode terminal
30r, 37r first connecting line (first conductive layer)
30b, 37g second connecting line (second conductive layer)
30g, 30g' third connecting line (third conductive layer)
31r, 36r, 38r first short bar (first conductive layer)
31b, 36b, 38g second short bar (second conductive layer)
31g, 36g, 38b third short bar (first conductive layer)
33 gate insulating film (first insulating layer)
34 protective insulating film (second insulating layer)
35 interlayer insulating film (second insulating layer)
37b1 first connecting portion (second conductive layer) of third connecting line
37b2 second connecting portion (third conductive layer) of third connecting line
40a first connecting line (first conductive layer)
40b1 first connecting portion (second conductive layer) of third connecting line
40b2 second connecting portion (third conductive layer) of third connecting line
40c second connecting line (second conductive layer)
40d1 first connecting portion (second conductive layer) of fourth connecting line
40d2 second connecting portion (third conductive layer) of fourth connecting line
41a first short bar (first conductive layer)
41b second short bar (second conductive layer)
41c third short bar (first conductive layer)
41d fourth short bar (second conductive layer)
43r1 first connecting portion (first conductive layer) of first connecting line
43r2 second connecting portion (second conductive layer) of first connecting line
43g second connecting line (first conductive layer)
43b1 first connecting portion (first conductive layer) of third connecting line
43b2 second connecting portion (third conductive layer) of third connecting line
44r first short bar (second conductive layer)
44g second short bar (first conductive layer)
44b third short bar (second conductive layer)
S, S1 to SM, Sr, Sg, Sb source line (data line)
Sr1, Sg1, Sb1 end portion (of source line (data line)) (first conductive layer)
G, G1 to GN, g1 to g4 gate line (scan line)
g1a end portion (of gate line (scan line)) (first line; first conductive layer)
g2a end portion (of gate line (scan line)) (second line; first conductive layer)
g3a end portion (of gate line (scan line)) (third line; second conductive layer)
g4a end portion (of gate line (scan line)) (fourth line; second conductive layer)

The invention claimed is:

1. An active matrix substrate, comprising:
a plurality of data lines and a plurality of scan lines arranged in a matrix; and
at least three short bars individually and separately connected to at least either of the plurality of data lines or the plurality of scan lines,
wherein each of said at least three short bars is connected to a prescribed number of corresponding data lines or scan lines, and
wherein, among said at least three short bars, there exist three adjacent short bars in which a middle short bar is provided in a different layer from short bars on both sides thereof,
wherein, among the at least three short bars, the three adjacent short bars are configured such that either the middle short bar or the short bars on both sides thereof is made of a first conductive layer provided on a base member,
wherein another of the middle short bar and the short bars on both sides thereof is made of a second conductive layer provided on a first insulating layer covering the first conductive layer, wherein at least one of said at least three short bars is connected to a connecting line that is integrally formed with, and made of a same material as, said at least one of the at least three short bars, said connecting line being connected to an end of a corresponding data line or scan line, wherein each of the data lines or scan lines to which the at least three short bars are connected has an electrode terminal, to which a driver that drives the corresponding data line or scan line is connected, adjacent to the end of the corresponding date line or scan line, wherein a cut region for separating the data lines or the scan lines from the at least three short bars is provided in a region between the electrode terminals and the at least three short bars within a driver mounting region in which the driver is to be mounted, and wherein driver input terminals are provided at an outer side of the electrode terminals in a plan view, and said cut region and said at least three short bars are disposed in a region between the electrode terminals and said driver input terminals.

2. The active matrix substrate according to claim 1, wherein, among the at least three short bars, the three adjacent short bars are configured such that edges of the middle short bar overlap edges of the respective short bars on both sides thereof.

3. The active matrix substrate according to claim 1, wherein, among the at least three short bars, the three adjacent short bars are configured such that the middle short bar does not overlap the respective short bars on both sides thereof.

4. The active matrix substrate according to claim 1,
wherein end portions of the data lines or end portions of the scan lines are made of the first conductive layer,
wherein, among three adjacent lines of the data lines or the scan lines, a line on one side of a middle line is connected to a first short bar made of the first conductive layer through a first connecting line made of the first conductive layer,
wherein, a line on another side of the middle line is connected to a second short bar made of the second conductive layer through a second connecting line made of the second conductive layer, and
wherein the middle line is connected to a third short bar made of the first conductive layer through a third connecting line made of a third conductive layer provided on a second insulating layer covering the second conductive layer.

5. The active matrix substrate according to claim 4, wherein a plurality of said third connecting lines are connected to each other over the third short bar.

6. The active matrix substrate according to claim 1,
wherein end portions of the data lines or end portions of the scan lines are made of the first conductive layer,
wherein, among three adjacent lines of the data lines or the scan lines, a line on one side of a middle line is connected to a first short bar made of the first conductive layer through a first connecting line made of the first conductive layer,
wherein, the middle line is connected to a second short bar made of the second conductive layer through a second connecting line made of the second conductive layer, and
wherein a line on another side of the middle line is connected to a third short bar made of the first conductive layer through a first connecting portion of a third connecting line made of the second conductive layer, and a second connecting portion of the third connecting line made of a third conductive layer provided on a second insulating layer covering the second conductive layer.

7. The active matrix substrate according to claim 6,
wherein the middle line is connected to the second connecting line at the electrode terminal provided on a tip of an end portion of a corresponding data line or a tip of an end portion of a corresponding scan line, the electrode terminal being connected to an electrode of the driver that drives the corresponding data line or scan line, and
wherein said line on another side of the middle line is connected to the first connecting portion of the third connecting line at the electrode terminal provided on a tip of an end portion of a corresponding data line or a tip of an end portion of a corresponding scan line, the electrode terminal being connected to an electrode of the driver that drives the corresponding data line or scan line.

8. The active matrix substrate according to claim 6, wherein, in the third connecting line, the first connecting portion and the second connecting portion are connected to each other over the first short bar.

9. The active matrix substrate according to claim 1,
wherein among end portions of the data lines or end portions of the scan lines, end portions of adjacent two lines are respectively made of the first conductive layer and the second conductive layer,
wherein, among four adjacent lines of the data lines or the scan lines, a first line made of the first conductive layer is connected to a first short bar made of the first conductive layer through a first connecting line made of the first conductive layer,
wherein a third line made of the second conductive layer is adjacent to the first line and is connected to a third short bar made of the first conductive layer through a first connecting portion of a third connecting line made of the second conductive layer, and a second connecting portion of the third connecting line made of a third conductive layer provided on a second insulating layer covering the second conductive layer,
wherein a second line made of the first conductive layer is adjacent to the third line and is connected to a second short bar made of the second conductive layer through a second connecting line made of the second conductive layer, and
wherein a fourth line made of the second conductive layer is adjacent to the second line and is connected to a fourth short bar made of the second conductive layer through a first connecting portion of a fourth connecting line made of the second conductive layer, and a second connecting portion of the fourth connecting line made of a third conductive layer.

10. The active matrix substrate according to claim 9, wherein the second line is connected to the second connecting line at the electrode terminal provided on a tip of an end portion of a corresponding data line or a tip of an end portion of a corresponding scan line, the electrode terminal being connected to an electrode of the driver that drives the corresponding data line or scan line.

11. The active matrix substrate according to claim 9, wherein, in the third connecting line and the fourth connecting line, the respective first connecting portion and second connecting portion are connected to each other over the first short bar.

12. The active matrix substrate according to claim 1,
wherein end portions of the data lines or end portions of the scan lines are made of the first conductive layer, wherein, among three adjacent lines of the data lines or the scan lines, a line on one side of a middle line is connected to a first short bar made of the second conductive layer through a first connecting portion of a first connecting line made of the first conductive layer, and a second connecting portion of the first connecting line made of the second conductive layer, wherein, the middle line is connected to a second short bar made of the first conductive layer through a second connecting line made of the first conductive layer, and wherein a line on another side of the middle line is connected to a third short bar made of the second conductive layer through a first connecting portion of a third connecting line made of the first conductive layer, and a second connecting portion of the third connecting line made of a third conductive layer provided on a second insulating layer covering the second conductive layer.

13. The active matrix substrate according to claim 4, comprising:

thin film transistors and pixel electrodes connected to the thin film transistors, wherein the pixel electrodes are made of the third conductive layer.

* * * * *